US009136363B2

(12) United States Patent
Park et al.

(10) Patent No.: US 9,136,363 B2
(45) Date of Patent: Sep. 15, 2015

(54) COMPOUND TUNNELING FIELD EFFECT TRANSISTOR INTEGRATED ON SILICON SUBSTRATE AND METHOD FOR FABRICATING THE SAME

(75) Inventors: Byung-Gook Park, Seoul (KR); Seongjae Cho, Seoul (KR); In Man Kang, Seoul (KR)

(73) Assignees: Seoul National University R&DB FOUNDATION (KR); Kyungpook National University Industry-Academic Cooperation Foundation (KR); The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 14/357,685

(22) PCT Filed: Dec. 30, 2011

(86) PCT No.: PCT/US2011/068064
§ 371 (c)(1),
(2), (4) Date: May 12, 2014

(87) PCT Pub. No.: WO2013/101172
PCT Pub. Date: Jul. 4, 2013

(65) Prior Publication Data
US 2014/0291616 A1 Oct. 2, 2014

(51) Int. Cl.
*H01L 29/06* (2006.01)
*H01L 29/775* (2006.01)
(Continued)

(52) U.S. Cl.
CPC ........ *H01L 29/775* (2013.01); *H01L 29/66356* (2013.01); *H01L 29/66439* (2013.01);
(Continued)

(58) Field of Classification Search
CPC .................. H01L 29/66439; H01L 29/66356; H01L 29/7391
USPC .......................................................... 257/27
See application file for complete search history.

(56) References Cited

U.S. PATENT DOCUMENTS 7,947,557 B2   5/2011  Chen et al.
2008/0224224 A1  9/2008  Vandenderghe et al.
(Continued)

FOREIGN PATENT DOCUMENTS

KR   10-2011-0024328   3/2011
KR   10-1058370        8/2011
WO   2010/078054       7/2010

OTHER PUBLICATIONS

International Search Report of Sep. 24, 2012.
(Continued)

*Primary Examiner* — Douglas Menz
(74) *Attorney, Agent, or Firm* — Gerald E. Hespos; Michael J. Porco; Matthew T. Hespos

(57) ABSTRACT

Compound tunneling field effect transistors integrated on a silicon substrate are provided with increased tunneling efficiency and an abrupt band slope by forming a source region with a material having a bandgap at least 0.4 electron volts (eV) narrower than that of silicon to increase a driving current (ON current) by forming a channel region with a material having almost no difference in lattice constant from a source region and having a high electron mobility at least 5 times higher than silicon. ON/OFF current ratio simultaneously is increased by forming a drain region with a material having a bandgap at least as wide as a channel region material to restrain OFF current. Tunneling field effect transistors having various threshold voltages according to circuit designs are formed easily by adding a specific material with an electron affinity less than a source region material when forming a channel region.

52 Claims, 20 Drawing Sheets

(51) Int. Cl.
*H01L 29/66* (2006.01)
*H01L 29/739* (2006.01)
*H01L 29/267* (2006.01)
*H01L 29/423* (2006.01)

(52) U.S. Cl.
CPC ......... *H01L29/7391* (2013.01); *H01L 29/0657* (2013.01); *H01L 29/267* (2013.01); *H01L 29/42312* (2013.01)

(56) References Cited

U.S. PATENT DOCUMENTS

2009/0242873 A1 10/2009 Pillarisetty et al.
2010/0163845 A1 7/2010 Goel et al.
2010/0295058 A1 11/2010 Cho

OTHER PUBLICATIONS

Declaration: Non-Prejudicial Disclosure or Exception to Lack of Novelty.

COMPOUND TUNNELING FIELD EFFECT TRANSISTOR INTEGRATED ON SILICON SUBSTRATE AND METHOD FOR FABRICATING THE SAME

BACKGROUND

1. Field of the Invention

The present invention relates to tunneling field effect transistors (TFETs), and more particularly to tunneling field effect transistors formed by compound semiconductors on a silicon substrate and methods for fabricating the same.

2. Description of the Related Art

These days, it is aiming for a goal that not only switch devices, but also various kinds of optical devices are integrated on a silicon substrate due to cost-effectiveness.

So far, the optical devices in many cases are basically fabricated with direct bandgap compound semiconductors, but the various kinds of switch device of peripheral circuits for driving the optical devices are fabricated on a silicon substrate. Thus, there is a problem that an optical integrated system must be fabricated through complicated processes.

Namely, the problem has occurred in the fabrication of the optical integrated system through the separation process for an optical device forming region and a peripheral circuit forming region.

To solve the problem, it is needed to develop new switch devices and processes for forming simultaneously the peripheral circuits in a fabrication process of the optical devices.

Until now a MOSFET is conventionally used as a switch device which is essentially needed not only in the optical integrated system, but also in various kinds of system having electrical circuits. However, it is reached to limit because of needs of a higher effective device and a smaller device with size decreased gradually by increasing integrity degree. And an alternative device is being needed.

Namely, as mentioned in Korean Patent No. 10-1058370, the conventional MOSFET has a basic problem of a considerable decrease in performance in case of a low driving voltage due to the physical limit, i.e., a subthreshold swing (SS) of MOSFET cannot be lower than 60 mV/dec at room temperature.

However, a tunneling field effect transistor controls flows of electrons or holes by a tunneling mechanism which differs from a thermionic emission of the conventional MOSFET, and a finer change of input voltage (driving voltage) can bring on a larger change in output current.

It is suggested that a change of ON/OFF states is very rapidly occurred according to the change of gate voltage and also it means that a low subthreshold swing (SS) is possible.

And because it is expected that a normal operation is possible in condition of very low driving voltage as like as below 1V, a tunneling field effect transistor can consume a few power and obtain a performance similar to a conventional MOSFET. Therefore, a tunneling field effect transistor is hoped to a switch device with high energy efficiency and a semiconductor device which can substitute for a conventional MOSFET.

A tunneling field effect transistor which basically differs from a conventional MOSFET, as shown in FIG. 1, has an asymmetric structure of a source region 200 and a drain region 400 formed by a dopant with an opposite conductive type each other on both ends of a channel region 300.

For example, in n channel TFET case, a source region 200 is formed as P+ region and a drain region 400 is formed as N+ region on both ends of a channel region 300 in P-type or intrinsic silicon-on-insulator (SOI) substrate on a buried oxide layer 100. Here, the P+ region and the N+ region are meant as a heavy doped P-type layer and a heavy doped N-type layer, respectively (hereinafter, the same is used).

In the structure of FIG. 1, if a driving voltage is applied to a gate electrode 600 on a gate insulator 500 and a reverse bias voltage is applied between a source region 200 and a drain region 400 respectively, an abrupt junction with a sharp energy band slope is formed between a channel region 300 and a source region 200 as shown in FIG. 2, and a driving current (ION) is flowed by a quantum mechanical tunneling.

However, because a driving current of a tunneling field effect transistor is induced by a tunneling phenomenon, current value lower than that of MOSFET is a problem.

Thus, a first technological problem to completely substitute a tunneling field effect transistor for a MOSFET is to be increasing a driving current (ION) to the value similar to that of a driving current of MOSFET.

Also, because the structure of a tunneling field effect transistor is activated by applying a reverse bias voltage to a p-i-n diode with a gate, a leakage current is basically less than a MOSFET, but an ambipolar operation is possible. As shown in FIG. 3, when a driving voltage of a gate is changed from positive to negative (namely, when OFF voltage is applied), a place in which a tunneling is occurring is changed from P+ region to N+ region and the leakage current can be increased because of the tunneling at an unintended region. It is considered as a problem for decreasing ON/OFF current ratio.

Specifically, it increases the consumption of a standby power in portable electronic devices. And so a second technological problem to completely substitute for a MOSFET is urgently minimizing the OFF current.

According to circuit designs, many transistors having various threshold voltages are needed. But a conventional tunneling field effect transistor, as shown in FIG. 1, is formed on a SOI substrate. And so there is a problem that it is difficult to control easily the threshold voltage by a boron ion implantation as like as in a bulk MOSFET.

That is a third technological problem to completely substitute a tunneling field effect transistor for a MOSFET.

To solve the first technological problem, U.S. Pat. No. 7,947,557 and International Publication No. WO2010/078054 disclose a source region (P+ region) material that has a bandgap less than that of silicon and Korean Patent Publication No. 10-2011-0024328 discloses an abrupt junction with a rapid band slope by a high-k dielectric layer. In addition, Korean Patent No. 10-1058370 discloses a trap layer formed between channel and source regions for increasing a driving current.

Korean Patent Publication No. 10-2011-0024328 and Korean Patent No. 10-1058370 disclose methods fabricated with silicon, but there is a difficult problem that tunneling field effect transistors cannot be simultaneously formed with optical devices fabricated basically with compound semiconductors.

U.S. Pat. No. 7,947,557 discloses a fabricating method that allows it to form with a compound semiconductor substrate, but there is a problem that the price of the compound semiconductor substrate is much higher than that of a silicon substrate.

International Publication No. WO2010/078054 discloses a source material which is InAs class materials with a bandgap less than that of silicon for increasing a tunneling current and detailed embodiments of III-V compounds (e.g., InGaAs and GaAsSb). But a lattice constant of InAs class materials is 6.06 Å and InGaAs and GaAsSbn disclosed as detailed embodiments have 5.87 Å lattice constant similar to that of InP. Therefore, the lattice constants of these materials have considerable differences from 5.43 Å lattice constant which is the lattice constant of silicon, and have a problem that it does not allow to grow the materials on a silicon substrate for forming a device. Thus, the compound semiconductor substrate with high price should be used as like as U.S. Pat. No. 7,947,557.

To solve the second technological problem, US Patent Publication No. 20080224224 and Korean Patent Publication No. 10-2011-0024328 disclose a separating method which does not overlap a gate to anyone of P+ region and N+ region, but it cannot be accepted as a preferable solution because of the large loss of area induced by the separation.

Also, to solve the third technological problem, recently, it is mainly achieved by changing gate material and controlling work function of the gate material.

In case of the method, it has some problems that a fabrication process is very complex because gate materials had to differ from each other as much as the number of switch devices to obtain different threshold voltages on one substrate and that the existence of gate material having a required work function is also not guaranteed.

Specifically, in case that peripheral circuit is formed simultaneously with optical device fabrication process, the process is becoming much more complex. Thus, new method is needed to shift easily the threshold voltage of each device.

The present invention proposes to solve the problems of the conventional technology and, specifically, the objective is to provide compound tunneling field effect transistors integrated on a silicon substrate and methods for fabricating the same for simultaneously forming peripheral circuit in optical device fabrication process on a silicon substrate and for solving the first through third technological problems required to completely substitute for conventional MOSFETs.

SUMMARY OF THE INVENTION

To achieve the objective of the present invention, a compound tunneling field effect transistor according to the present invention has the first exemplary mode comprising: a silicon substrate; a source region formed of a first semiconductor material having a lattice constant difference with silicon 5% or less, a bandgap at least 0.4 electron volts (eV) narrower than that of silicon and a first conductive type on the silicon substrate; a channel region formed of a second semiconductor material having a lattice constant difference with the first semiconductor material 2% or less, a bandgap wider than that of the first semiconductor material and electron mobility at least 5 times higher than that of silicon on the source region; a drain region formed of a third semiconductor material having a lattice constant difference with the second semiconductor material 1% or less, a bandgap wider than or equal to that of the second semiconductor material and a second conductive type opposite to the first conductive type on the channel region; a gate dielectric layer formed on a sidewall of the channel region; and a gate electrode formed on the gate dielectric layer, wherein a vertical channel is further included.

Here, a part of the source region, the channel region and the drain region can be projected with a pillar shape on the silicon substrate, the gate dielectric layer can be formed to wrap the pillar shape, and the gate electrode can be formed to wrap one sidewall, both sidewalls or all sidewalls of the pillar shape on the gate dielectric layer.

Or a part of the source region, the channel region and the drain region can be projected with a mesa structure on the silicon substrate, the gate dielectric layer can be formed on the mesa structure, and the gate electrode can be formed over a sidewall of the mesa structure being separated by the gate dielectric layer.

A compound tunneling field effect transistor according to the present invention has the second exemplary mode comprising: a silicon substrate; a source region formed of a first semiconductor material having a lattice constant difference with silicon 5% or less, a bandgap at least 0.4 electron volts (eV) narrower than that of silicon and a first conductive type on the silicon substrate; a channel region formed of a second semiconductor material having a lattice constant difference with the first semiconductor material 2% or less, a bandgap wider than that of the first semiconductor material and electron mobility at least 5 times higher than that of silicon being contacted laterally to the source region; a drain region formed of a third semiconductor material having a lattice constant difference with the second semiconductor material 1% or less, a bandgap wider than or equal to that of the second semiconductor material and a second conductive type opposite to the first conductive type having a horizontal interval from the source region and being contacted to the channel region; a gate dielectric layer formed on the channel region; and a gate electrode formed on the gate dielectric layer, wherein a horizontal channel is further included.

Here, the source region can be projected with a mesa structure on the silicon substrate, the channel region can be formed at a lower sidewall of the mesa structure on the silicon substrate, the drain region can be formed on the channel region, and the gate electrode can be formed over an upper sidewall of the mesa structure being separated by the gate dielectric layer on the source region and the channel region.

A compound tunneling field effect transistor according to the present invention has the third exemplary mode as following: in the first and second exemplary modes of a compound tunneling field effect transistor, a buffer layer can be further formed of silicon germanium (SiGe) between the silicon substrate and the source region, the first semiconductor material can be germanium (Ge), and the second and third semiconductor materials can be gallium arsenide (GaAs).

The channel region can be formed of aluminum gallium arsenide (AlxGa1-xAs) adding aluminum to the second semiconductor material.

And the content (x) of aluminum can be 0<x≤0.45.

A compound tunneling field effect transistor according to the present invention has the fourth exemplary mode comprising: a common source region formed in a stair shape having at least vertical and horizontal planes one side thereof and formed of a first semiconductor material having a first conductive type on a predetermined substrate; a common channel region formed in an 'L' shape on the vertical and horizontal planes of the common source region and formed of a second semiconductor material having a lattice constant difference with the first semiconductor material 2% or less, a bandgap wider than that of the first semiconductor material and electron mobility at least 5 times higher than that of silicon; a common drain region formed with a specific interval from the vertical and horizontal planes of the common source region, respectively, and formed of a third semiconductor material having a lattice constant difference with the second semiconductor material 1% or less, a bandgap wider than or equal to that of the second semiconductor material and a second conductive type opposite to the first conductive type on the common channel region; a first gate electrode formed on a first gate dielectric layer interlaid on an upper part of the vertical plane of the common source region and on the common channel region; and a second gate electrode formed on a second gate dielectric layer interlaid on the sidewalls of the common drain and channel regions and on one side of the horizontal plane of the common source region, wherein horizontal and vertical channels are formed.

Here, the substrate can be a silicon substrate, a buffer layer can be further formed of silicon germanium (SiGe) between the substrate and the common source region, the first semiconductor material can be germanium (Ge), and the second and third semiconductor materials can be gallium arsenide (GaAs).

The channel region can be formed of aluminum gallium arsenide (AlxGa1-xAs) adding aluminum to the second semiconductor material.

And the content (x) of aluminum can be $0<x\leq0.45$.

A method for fabricating a compound tunneling field effect transistor according to the present invention has the first exemplary mode comprising: a first step of epitaxially growing a first semiconductor layer having a bandgap at least 0.4 electron volts (eV) narrower than that of a silicon substrate with in situ doping of a dopant having a first conductive type on the silicon substrate; a second step of epitaxially growing a second semiconductor layer having a bandgap wider than that of the first semiconductor layer and electron mobility at least 5 times higher than that of the silicon substrate on the first semiconductor layer; a third step of epitaxially growing a third semiconductor layer having a bandgap wider than or equal to that of the second semiconductor layer with in situ doping of a dopant having a second conductive type opposite to the first conductive type on the second semiconductor layer; a fourth step of forming drain, channel and source regions by etching the third, second and first semiconductor layers, respectively; a fifth step of forming a gate dielectric layer on the drain, channel and source regions; and a sixth step of forming a gate electrode by deposing and etching a gate material on the gate dielectric layer.

Here, the etching of the third, second and first semiconductor layers in the fourth step can be carried out until a part of the first semiconductor layer is etched and a pillar shape is projected to form drain, channel and source regions from an upper part thereof, and the etching of the gate material in the sixth step can be to form the gate electrode wrapped one sidewall, both sidewalls or all sidewalls of the pillar shape interlaid with the gate dielectric layer.

Or the etching of the third, second and first semiconductor layers in the fourth step can be carried out until a part of the first semiconductor layer is etched and a mesa structure having a sidewall on one side thereof is projected to form drain, channel and source regions from an upper part thereof, and the etching of the gate material in the sixth step can be to form the gate electrode over the sidewall of the mesa structure interlaid with the gate dielectric layer.

A method for fabricating a compound tunneling field effect transistor according to the present invention has the second exemplary mode comprising: a first step of forming a channel region by epitaxially growing a second semiconductor layer having electron mobility at least 5 times higher than that of a silicon substrate on the silicon substrate; a second step of forming a source region by forming a first mask on the second semiconductor layer, etching one side of the second semiconductor layer using the first mask, and epitaxially growing a first semiconductor layer having a bandgap at least 0.4 electron volts (eV) narrower than that of the silicon substrate with in situ doping of a dopant having a first conductive type; a third step of forming a drain region by forming a second mask on the first and second semiconductor layers, etching the other side of the second semiconductor layer using the second mask, and epitaxially growing a third semiconductor layer having a bandgap wider than or equal to that of the second semiconductor layer with in situ doping of a dopant having a second conductive type opposite to the first conductive type; a fourth step of forming a gate dielectric layer on the source, channel and drain regions; and a fifth step of forming a gate electrode by deposing and etching a gate material on the gate dielectric layer.

A method for fabricating a compound tunneling field effect transistor according to the present invention has the third exemplary mode comprising: a first step of forming a source region having an projected mesa structure by epitaxially growing and etching a first semiconductor layer having a bandgap at least 0.4 electron volts (eV) narrower than that of a silicon substrate with in situ doping of a dopant having a first conductive type on the silicon substrate; a second step of forming a drain region a channel region by epitaxially growing a second semiconductor layer having electron mobility at least 5 times higher than that of the silicon substrate on the projected source region, epitaxially growing a third semiconductor layer having a bandgap wider than or equal to that of the second semiconductor layer with in situ doping of a dopant having a second conductive type opposite to the first conductive type on the second semiconductor layer, and anisotropically etching the third and second semiconductor layers, respectively; a third step of forming a gate dielectric layer on the source, channel and drain regions; and a fourth step of forming a gate electrode by deposing and etching a gate material on the gate dielectric layer.

Here, the anisotropically etching of the third and second conductor layers in the second step can be to form the channel region on a lower sidewall of the mesa structure and to form the drain region on the channel region, and the etching of the gate material in the fourth step can be to form, by an anisotropically etching, the gate electrode over an upper sidewall of the mesa structure being separated by the gate dielectric layer on the source and channel regions.

Or the etching of the first semiconductor layer in the first step can be to form the source region in a stair shape having at least vertical and horizontal planes on one side thereof, the anisotropically etching of the third and second conductor layers in the second step can be to form the channel region in an 'L' shape on the vertical and horizontal planes of the source region and to form the drain region having an interval for separating from the vertical and horizontal planes of the source region, respectively, and the etching of the gate material in the fourth step can be to form, by an anisotropically etching, a first gate electrode over an upper part of the vertical plane of the source region and over the channel region interlaid with the gate dielectric layer, respectively, and to form a second gate electrode over sidewalls of the drain and channel regions and over one side of the horizontal plane of the source region interlaid with the gate dielectric layer, respectively.

A method for fabricating a compound tunneling field effect transistor according to the present invention has the fourth exemplary mode as following: in the first through third exemplary modes of a method for fabricating a compound tunneling field effect transistor, further comprising epitaxially growing a buffer layer of silicon germanium (SiGe) on the silicon substrate before the first step, wherein: the first semiconductor layer can be epitaxially grown with germanium (Ge), and the second and third semiconductor layers can be epitaxially grown with gallium arsenide (GaAs).

Here, when the second semiconductor layer is epitaxially grown with gallium arsenide (GaAs), aluminum can be added to form aluminum gallium arsenide (AlxGa1-xAs). And the content (x) of aluminum can be $0<x\leq0.45$.

The present invention enables to reduce a fabrication cost to a great amount by replacing the conventional expensive compound semiconductor substrate with a silicon substrate and to solve the problems occurred by the separation process in the conventional fabrication process by achieving a recent goal such as an optical device formation on a silicon substrate and together by processing a fabrication process according to the present invention in the optical device fabrication process.

In addition, the present invention enables to increase tunneling efficiency with an abrupt band slope by forming a source region with a material having a bandgap at least 0.4 electron volts (eV) narrower than that of silicon, to increase a driving current (ION) causing a low-current problem to the value similar to that of a driving current of MOSFET by forming a channel region with a material having almost no difference in lattice constant from a source region and having a high electron mobility at least 5 times higher than that of silicon, and to increase simultaneously ON/OFF current ratio to a great amount by forming a drain region with a material having a bandgap wider than or equal to that of a channel region material to restrain OFF current to the utmost.

Furthermore, the present invention enables to form easily tunneling field effect transistors having various threshold voltages according to circuit designs by adding a specific material (e.g. aluminum) to have an electron affinity less than that of a source region material in the process for forming a channel region, namely, to shift easily the threshold voltages by controlling the content of a specific material.

The invention may be better understood by the drawings that are briefly described below and attached hereto, in the several figures of which identical reference numbers (if any) refer to identical or similar elements.

In these drawings, the following reference numbers are used throughout: reference number 10 indicates a silicon substrate, 20 a buffer layer, 30 a first semiconductor layer, 31, 32, 33 and 34 a source region, 40 and 44 a second semiconductor layer, 41, 42, 43 and 45 a channel region, 50 and 54 a third semiconductor layer, 51, 52, 53 and 55 a drain region, 60, 62, 63 and 64 a gate dielectric layer, 70, 73 and 76 a gate material, 71, 72, 74, 75 and 77 a gate electrode, 80 a dielectric layer, 81 a first mask, 82 a second mask, 92 a source region contact plug, 94 and 96 a gate electrode contact plug and 98 a drain region contact plug.

DETAILED DESCRIPTION OF THE PREFERRED EMBODIMENTS

[Embodiment 1 on a Device Structure]

Figure 8:
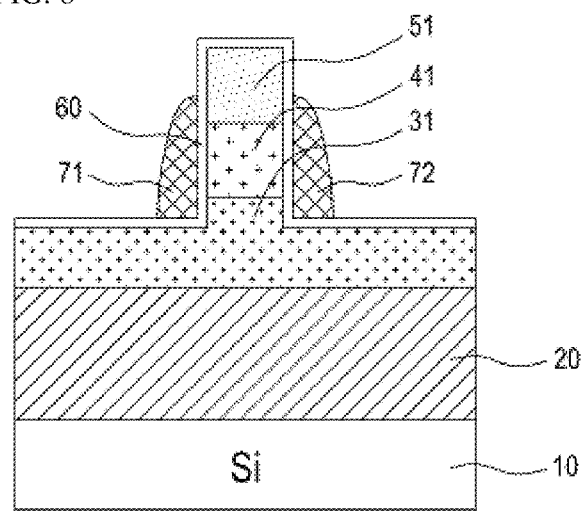
Figure 16:
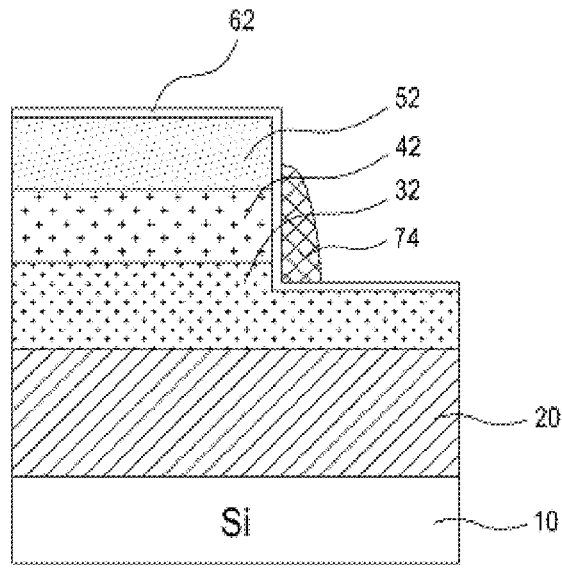

A compound tunneling field effect transistor according to Embodiment 1 of the present invention, as commonly shown in FIGS. 8 and 16, basically comprising: a silicon substrate 10; a source region 31 or 32 formed of a first semiconductor material having a lattice constant difference with silicon 5% or less, a bandgap at least 0.4 electron volts (eV) narrower than that of silicon and a first conductive type on the silicon substrate 10; a channel region 41 or 42 formed of a second semiconductor material having a lattice constant difference with the first semiconductor material 2% or less, a bandgap wider than that of the first semiconductor material and electron mobility at least 5 times higher than that of silicon on the source region 31 or 32; a drain region 51 or 52 formed of a third semiconductor material having a lattice constant difference with the second semiconductor material 1% or less, a bandgap wider than or equal to that of the second semiconductor material and a second conductive type opposite to the first conductive type on the channel region 41 or 42; a gate dielectric layer 60 or 62 formed on a sidewall of the channel region 41 or 42; and a gate electrode 71, 72 or 74 formed on the gate dielectric layer 60 or 62, wherein a vertical channel is further included.

By the above configuration, Embodiment 1 has the following effects.

Since the source region 31 or 32 is formed of a first semiconductor material having a first conductive type (e.g., P-type) and a lattice constant difference with a silicon substrate 5% or less, a semiconductor material (e.g., Ge etc.) used to optical devices can be also epitaxially grown on the silicon substrate for forming the source region 31 or 32.

Here, if the first semiconductor material has a lattice constant difference with the silicon substrate greater than 5%, it is difficult to epitaxially grow the first semiconductor material directly on the silicon substrate. Thus, in that case, it needs a plurality of buffer layers to form the first semiconductor material on the silicon substrate.

A buffer layer 20 is used between the silicon substrate 10 and the source region 31 or 32 as shown in FIGS. 8 and 16. However, as like as Embodiment 1, if the first semiconductor material has a lattice constant difference with the silicon substrate at least 5% or less, it is able to grow directly on the silicon substrate by the epitaxial growing without the buffer layer 20.

The reason is that the upper portion of the source region 31 or 32 contacted to the channel region 41 or 42 has an uniform lattice size, although an interface state of the junction between the silicon substrate and the source region 31 or 32 is not good due to the lattice constant difference when the source region 31 or 32 is grown to several micrometer thick in an active region which is vertically stacked with the source region 31 or 32/channel region 41 or 42/drain region 51 or 52 on the silicon substrate 10.

In addition, the first semiconductor material is required not only to be epitaxially grown directly on the silicon substrate, but also to have a bandgap at least 0.4 eV narrower than that of the silicon substrate. By the above requirement, a rapid slope of energy band, i.e., an abrupt junction is obtained not in the source region formed directly on the silicon substrate but in the junction with the channel region, and as a result, a driving current (ION) can be firstly increased by increasing a quantum mechanical tunneling efficiency.

Here, if the first semiconductor material has a bandgap within 0.4 eV narrower than that of the silicon substrate, the rapid band slope can not be formed to increase the driving current (ION). Although the narrower a bandgap is, the better the tunneling efficiency is for increasing the driving current (ION), but it is preferable to exclude a material which is difficult to epitaxially grow directly on the silicon substrate.

The channel region 41 or 42 is formed of a second semiconductor material which is intrinsic or slightly dopped with a P-type or N-type dopant on the source region 31 or 32, and the second semiconductor material has a lattice constant difference with the first semiconductor material 2% or less and a bandgap wider than that of the first semiconductor material. By the above configuration, the number of a carrier (i.e., electron or hole) trapped in the interface of junction with the source region 31 or 32 due to the lattice mismatch can be minimize and, at the same time, a semiconductor material (e.g., GaAs etc.) used to the optical devices can be also epitaxially grown to form the source region 31 or 32.

Here, if the channel region 41 or 42 is formed of a semiconductor material having a lattice constant difference with the first semiconductor material greater than 2% and a bandgap narrower than or equal to that of the first semiconductor material, there is a problem that the driving current (ION) can not be increased because, at the driving time, the number of a carrier (i.e., electron or hole) trapped in the interface of junction formed between the source region 31 or 32 and the channel region 41 or 42 is increasing by the lattice mismatch and the rapid band slope can not be formed.

In addition, the channel region 41 or 42 is formed of a second semiconductor material having a lattice constant difference with the first semiconductor material 2% or less and at the same time electron mobility at least 5 times higher than that of the silicon. By the above configuration, the number of carriers (i.e., electrons or holes) trapped in the interface of junction formed between the source region 31 or 32 and the channel region 41 or 42 is minimize, at the same time the drift velocities of tunneling carriers can be increased at least 5 times higher than that of a silicon device, and as a result, a driving current (ION) can be secondly increased.

Here, if the channel region 41 or 42 is formed of a semiconductor material having electron mobility within 5 times higher than that of the silicon, there is a problem that it is difficult to substitute for the conventional MOSFET because a driving current (ION) can not be increased as in the conventional technology though the number of tunneling carries are increased by the improved tunneling efficiency It is preferable that the channel region 41 or 42 is formed of a semiconductor material having higher electron mobility, but if the semiconductor material has a lattice constant difference with the first semiconductor material of the source region 31 or 32 greater than 2%, a driving current (ION), as mentioned above, can not be increased by the carrier trapping occurred due to the lattice mismatch in the interface. Thus, the lattice constant of the second semiconductor material will be also required to consider for increasing a driving current (ION).

Since the drain region 51 or 52 is formed of a third semiconductor material having a second conductive type (e.g., N-type) opposite to the first conductive type on the channel region 41 or 42 by epitaxy for having a lattice constant difference with the second semiconductor material within 1%, the carriers are almost entering the drain region 51 or 52 through the channel region 41 or 42 without any experience for the lattice difference and almost never trapped in the interface of the junction. As a result, a driving current (ION) can be increased.

Figure 1:
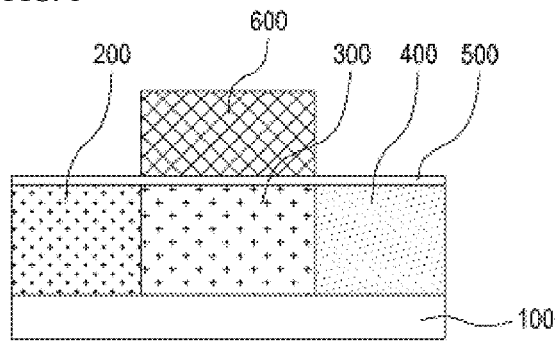
FIG. 1 is a cross-sectional view showing the basic structure of a conventional tunneling field effect transistor.
Figure 2:
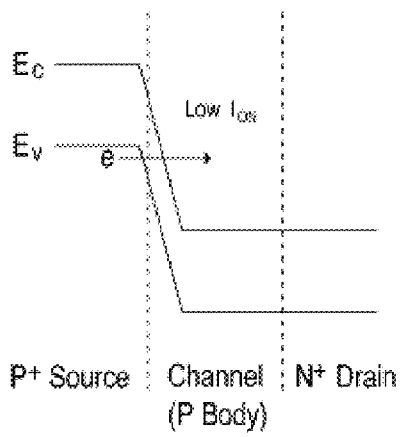
FIG. 2 is an energy band diagram for explaining a principle of a flow of a driving current (ION) by a quantum mechanical tunneling in formation of an abrupt junction between channel and source regions, as shown in FIG. 1, when a positive driving voltage is applied to a gate electrode and a reverse bias voltage is applied between source and drain regions, respectively.
Figure 3:
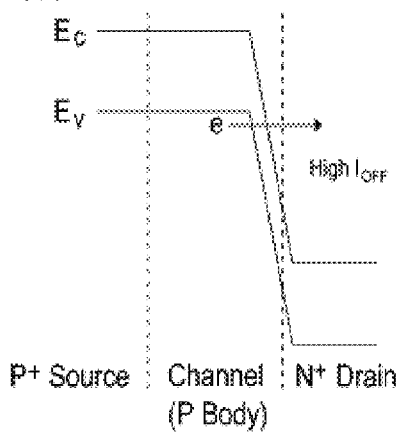
FIG. 3 is an energy band diagram for explaining a principle of an increment of a leakage current (OFF current) by a tunneling at an unintended region induced by changing a tunneling site from P+ region to N+ region, as shown in FIG. 1, when a driving voltage of a gate electrode is shifted from positive to negative (namely, when OFF voltage is applied to a gate electrode).

In addition, since the drain region 51 or 52 is formed of a material having a bandgap wider than or equal to that of the second semiconductor material, at the switch-off time, i.e., when a driving voltage is not applied to a gate electrode 71, 72 or 74 or a voltage (e.g., a negative voltage) with opposite polarity to the driving voltage is applied to the gate electrode, as shown in FIG. 3, the unintended tunneling can be restrained to the utmost in the interface between the channel region 41 or 42 and the drain region 51 or 52, and as a result, it can reduce an Off current (i.e., a leakage current).

Particularly, as shown in FIGS. 8 and 16, if the gate electrode 71, 72 or 74 is formed to overlap with the drain region 51 or 52 and a negative voltage is applied to the gate electrode 71, 72 or 74 in an n-channel TFET, it is appeared as a leakage current caused by GIDL (Gate Induced Drain Leakage).

At the switch-off time, to reduce the leakage current caused by GIDL, it is preferable that the gate electrode 71, 72 or 74 should be formed to underlap with the drain region 51 or 52, namely, to separate from the drain region. But, in that case, a driving voltage must be increased. And there is a problem that it dose not take advantage of a tunneling field effect transistor possible to operate by a low power.

As shown in FIGS. 8 and 16, in the structure of the gate electrode 71, 72 or 74 overlapped with the drain region 51 or 52, it is preferable that the drain region 51 or 52 should be formed of a material having a bandgap wider than that of the second semiconductor material for reducing the Off current (i.e., the leakage current) to the utmost. But, in that case, if the material of the drain region has a lattice constant difference with the second semiconductor material greater than 1%, as mentioned above, a driving current (ION) can be decreased by trapping of carriers in the junction.

In another aspect of Embodiment 1, as commonly shown in FIGS. 8 and 16, the gate dielectric layer 60 or 62 is formed on a sidewall of the channel region 41 or 42 by which the drain region 51 or 52 is separated vertically from the source region 31 or 32 on the silicon substrate 10, and the gate electrode 71, 72 or 74 is formed on the gate dielectric layer 60 or 62 for embodying a tunneling field effect transistor with a vertical channel.

By embodying a tunneling field effect transistor with a vertical channel as mentioned above, the channel length can be unlimitedly elongated without increasing an area.

To embody the above mentioned technological idea of Embodiment 1, the device structure can be various, but embodied by the structure shown in FIG. 8 or 16.

FIG. 8 shows that a part of the source region 31, the channel region 41 and the drain region 51 are projected with a pillar shape on the silicon substrate 10, the gate dielectric layer is formed to wrap the pillar shape, and the gate electrode 71 or 72 is formed on the gate dielectric layer 60.

The gate electrode 71 or 72 is formed on both sidewalls of the pillar shape shown in FIG. 8, but it can be formed on any one sidewall or formed to wrap on all sidewalls of the pillar shape.

Therefore, it is clear that a person ordinarily skilled in the art can readily embody a tunneling field effect transistor with a single gate electrode on one sidewall of the projected pillar shape, a tunneling field effect transistor with a double gate electrodes on both sidewalls of the projected pillar shape, and a tunneling field effect transistor with a GAA (Gate-All-Around) structure formed to wrap all sidewalls of the projected pillar shape from FIG. 8.

Figure 9:
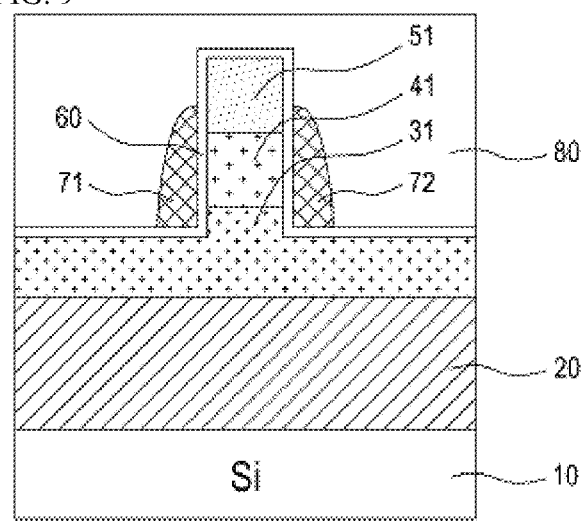
Figure 10:
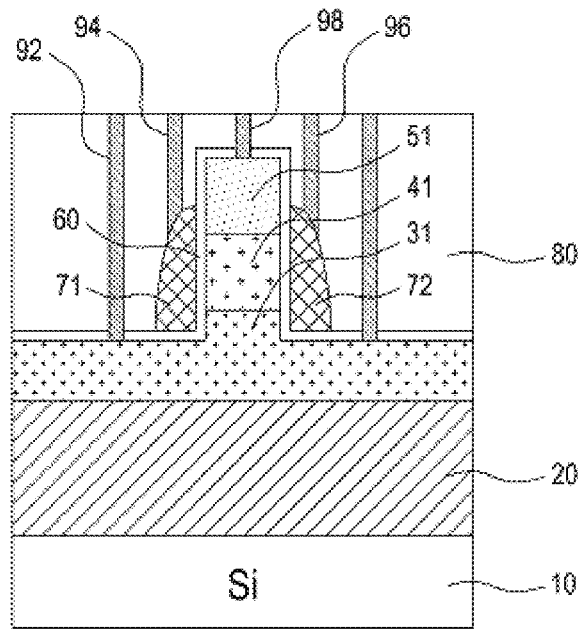

FIG. 9 shows a planarization of an insulating layer 80 covered on the structure shown in FIG. 8. FIG. 10 shows contact plugs 92, 94, 96 and 98 formed by filling a conductive material into contact holes for contacting the source region 31/channel region 41/drain region 51.

Figure 11:
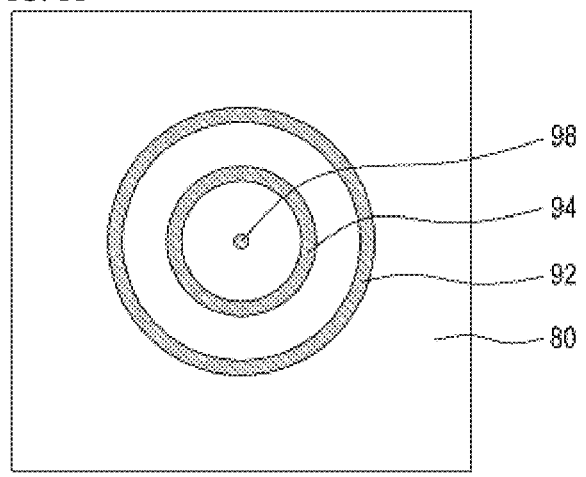
FIGS. 11 and 12 are showing embodiments of a contact structure being possible in case of seeing from the upper side of FIG. 10.
Figure 12:
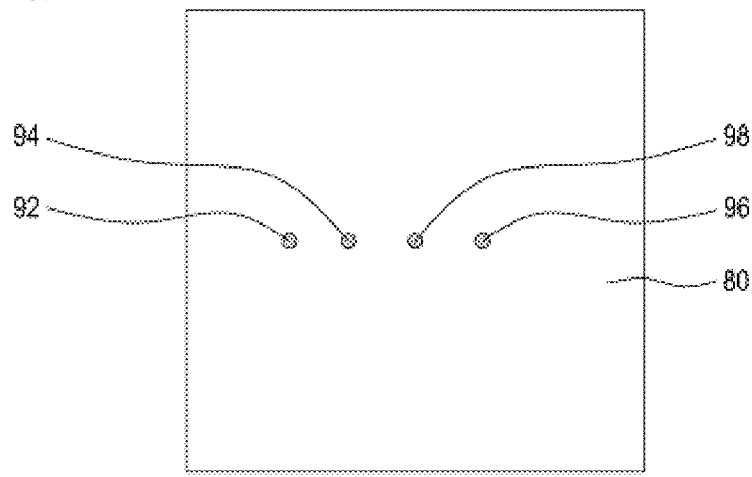

FIGS. 11 and 12 show exemplaries of contact structures that can be seen by viewing FIG. 10 from an upper side.

FIG. 11 shows a contact structure in the case of the GAA (Gate-All-Around) structure of the gate electrode 71 or 72 formed to wrap all sidewalls of the projected pillar shape shown in FIG. 8. The reference number 92 indicates a source region contact plug, 94 a gate electrode contact plug and 98 a drain region contact plug, respectively.

On the other hand, FIG. 12 shows a contact structure in the case of the double gate electrode structure of the gate electrodes 71 and 72 formed on both sidewalls of the projected pillar shape shown in FIG. 8. The reference number 92 indicates the source region contact plug, 94 and 96 gate electrode contact plugs and 98 a drain region contact plug, respectively.

FIG. 16 shows that a part of the source region 32, the channel region 42 and the drain region 52 are projected on the silicon substrate 10 with a mesa structure having a sidewall in at least one side thereof, that the gate dielectric layer 62 is formed on the mesa structure, and that the gate electrode 74 is formed on the gate dielectric layer 62 over a sidewall of the mesa structure.

Here, the mesa structure can be also formed by projecting the channel region 42 and the drain region 52 on the source region 32 without projecting a part of the source region 32.

[Embodiment 2 on a Device Structure]

Figure 21:
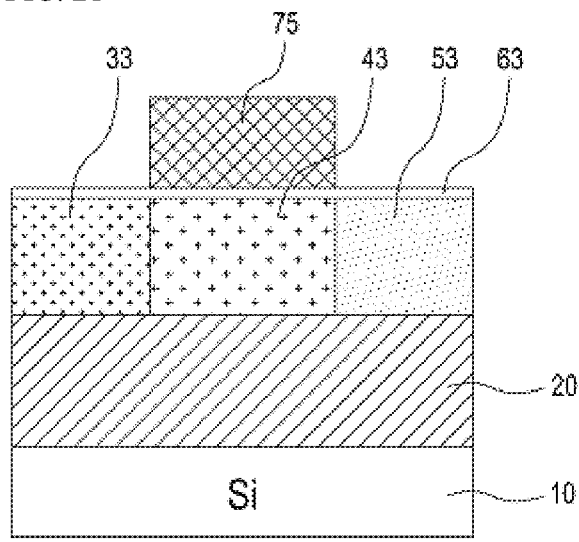
Figure 27:
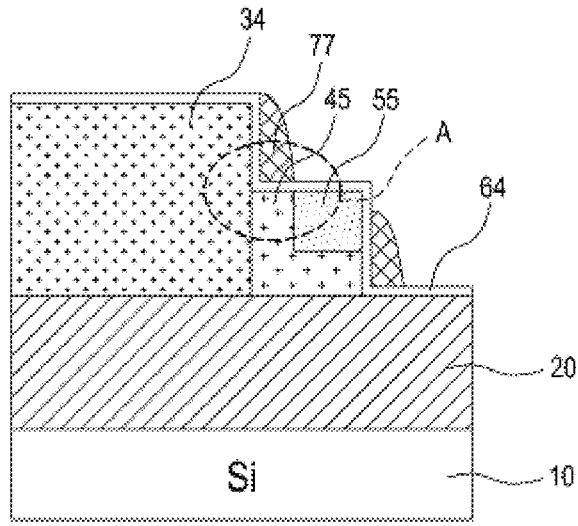
Figure 33:
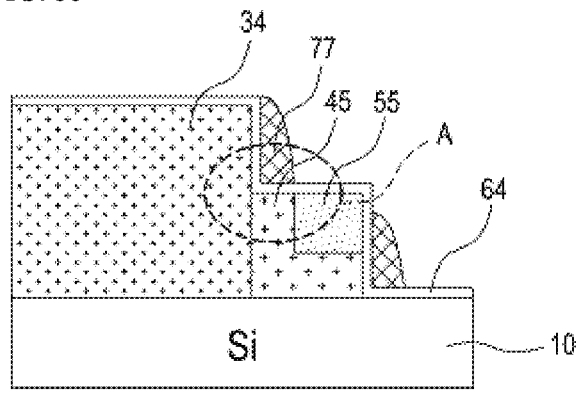

A compound tunneling field effect transistor according to Embodiment 2 of the present invention, as commonly shown in FIGS. 21, 27 and 33, basically comprising: a silicon substrate 10; a source region 33 or 34 formed of a first semiconductor material having a lattice constant difference with silicon 5% or less, a bandgap at least 0.4 electron volts (eV) narrower than that of silicon and a first conductive type on the silicon substrate 10; a channel region 43 or 45 formed of a second semiconductor material having a lattice constant difference with the first semiconductor material 2% or less, a bandgap wider than that of the first semiconductor material and electron mobility at least 5 times higher than that of silicon being contacted laterally to the source region 33 or 34; a drain region 53 or 55 formed of a third semiconductor material having a lattice constant difference with the second semiconductor material 1% or less, a bandgap wider than or equal to that of the second semiconductor material and a second conductive type opposite to the first conductive type having a horizontal interval from the source region 33 or 34 and being contacted to the channel region 43 or 45; a gate dielectric layer 63 or 64 formed on the channel region 43 or 45; and a gate electrode 75 or 77 formed on the gate dielectric layer 63 or 64, wherein a horizontal channel is further included.

As mentioned above, material characteristics of the source region 33 or 34, the channel region 43 or 45 and the drain region 53 or 55 are respectively equal to those of the compound tunneling field effect transistor according to Embodiment 1, and the above mentioned effects are appeared.

Therefore, Embodiment 2, as commonly shown in FIGS. 21, 27 and 33, has an only different point in comparison with Embodiment 1. The different point is that the source region 33 or 34 and the drain region 53 or 55 are horizontally separated with an interval of the channel region 43 or 45 on the silicon substrate 10.

In Embodiment 2, a buffer layer 20 is also used between the silicon substrate 10 and the source region 33 or 34 shown in FIGS. 21 and 27, but, as mentioned above and shown in FIG. 33, if the semiconductor material has a lattice constant difference with the silicon substrate 10 at least 5% or less, it is able to grow directly on the silicon substrate by the epitaxial growing without the buffer layer 20.

To embody the above mentioned technological idea of Embodiment 2, the device structure can be various, but embodied by the structure shown in FIG. 21, 27 or 33.

FIG. 21 shows that Embodiment 2 can be a conventional tunneling field effect transistor structure. But in that case, each material of the source region 33, the channel region 43 and the drain region 53 has the unique characteristics as mentioned above. And the above mentioned effects are appeared.

FIG. 27 shows a cell structure A consisted of a source region 34 projected with a mesa structure on the silicon substrate 10, a channel region 45 contacted to the source region 34 and formed in an 'L' shape at a lower sidewall of the mesa structure, a drain region 55 contacted to the channel region 45 and separated horizontally from the source region 34 with an interval of the channel region 45, a gate dielectric layer 64 formed on the source region 34 including the channel region 45, and a gate electrode 77 formed on the gate dielectric layer 64 over an upper sidewall of the mesa structure.

FIG. 33 shows a structure without the buffer layer 20 shown in FIG. 27. As mentioned above, the source region 34 can be epitaxially grown without the buffer layer 20 on the silicon substrate 10.

[Embodiment 3 on a Device Structure]

A compound tunneling field effect transistor according to Embodiment 3 of the present invention, as commonly shown in FIGS. 8, 16, 21 and 27, in the compound tunneling field effect transistor according to Embodiments 1 and 2, further comprises a buffer layer 20 formed of silicon germanium (SiGe) between the silicon substrate 10 and the source region 31, 32, 33 or 34. Wherein the first semiconductor material is germanium (Ge), and wherein the second and third semiconductor materials are gallium arsenide (GaAs).

By the above configuration, Embodiment 3 has the effects according to Embodiments 1 and 2 and additional effects as the following.

By the further formation of the buffer layer 20 with silicon germanium (SiGe) between the silicon substrate 10 and the source region 31, 32, 33 or 34, the source region 31, 32, 33 or 34 can be unformly formed of germanium (Ge) overcoming a lattice constant difference with the first semiconductor material (Ge) on the silicon substrate 10.

Therefore, to from a source region thinner than that of the other embodiments, as shown in FIGS. 16 and 27, to use a portion except the top surface of the source region 32 or 34 as an active region, as like as Embodiment 3, it is preferred to further form a buffer layer 20 with silicon germanium (SiGe) between the silicon substrate 10 and the source region 31, 32, 33 or 34.

Here, since the lattice constant of germanium (Ge) is 5.65 Å and about 4% greater than 5.43 Å of silicon (Si), as like as Embodiments 1 and 2, the source region 31, 32, 33 or 34 can be formed by the epitaxial growing directly on the silicon substrate 10.

In addition, since the lattice constant of gallium arsenide (GaAs) is 5.65 Å and equal to that of germanium (Ge). The conditions of Embodiments 1 and 2 meet. And a homogeneous channel region 41, 42, 43 or 45 can be formed by the epitaxial growing on the source region 31, 32, 33 or 34.

By using germanium (Ge) as the first semiconductor material and gallium arsenide (GaAs) as the second and third semiconductor materials, the compound tunneling field effect transistor (TFET) is embodied with heterojunction. The heterojunction TFET based on Ge/GaAs/GaAs, as shown in FIGS. 41 and 42, has distinguished electrical properties in comparison with that based on other materials.

Figure 41:
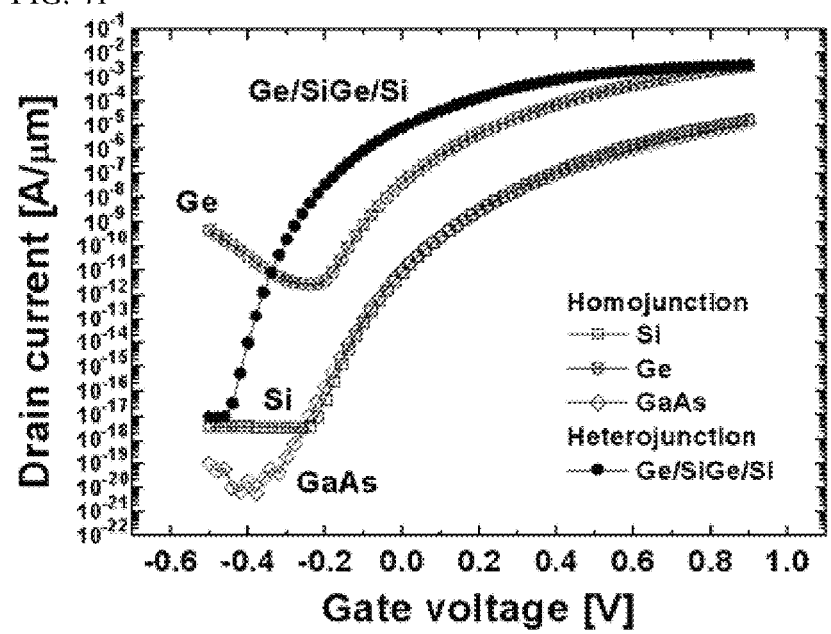
FIG. 41 is an electrical characteristic view for comparing values of ON and OFF currents of tunneling field effect transistors based on various materials.
Figure 42:
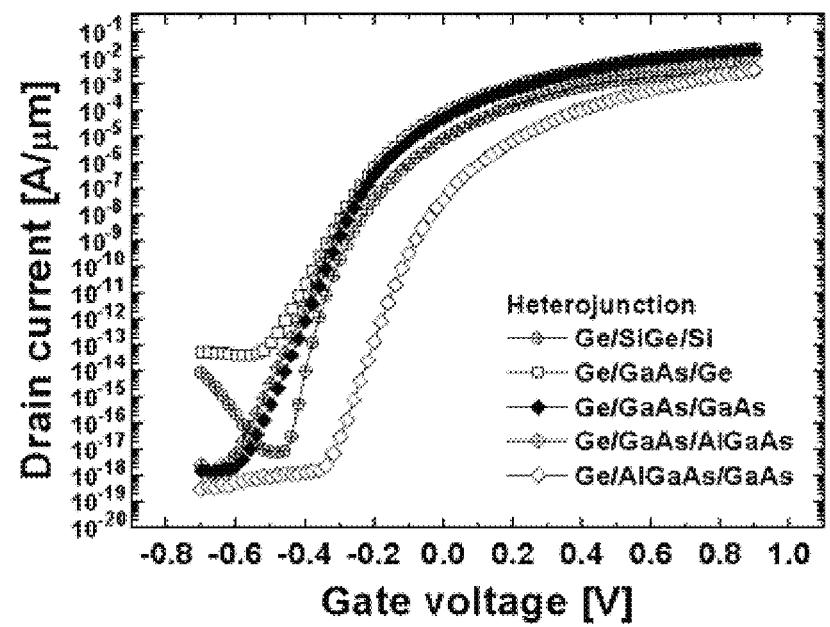
FIG. 42 is an electrical characteristic view for comparing values of ON and OFF currents of compound tunneling field effect transistors formed by various heterojunctions with a source region of germanium (Ge).

FIG. 41 is an electrical characteristic view for comparing values of ON and OFF currents of tunneling field effect transistors based on various materials, and FIG. 42 is an electrical characteristic view for comparing values of ON and OFF currents of compound tunneling field effect transistors formed by various heterojunctions with a source region of germanium (Ge).

Here, the ON current is called a drain current when a voltage higher than a threshold voltage is applied to a gate electrode and the Off current is called a drain current when a negative voltage lower than a threshold voltage is applied to a gate electrode.

When a tunneling field effect transistor is embodied by the same material, namely, a homojunction, as shown in FIG. 41, germanium (Ge) has an ON current higher than that of silicon (Si). The reason is that germanium (Ge) has a bandgap narrower than that of silicon (Si), i.e., Eg, Ge=0.67 eV and Eg, Si=1.11 eV. And the tunneling efficiency of germanium (Ge) is better than that of silicon (Si).

On the other hand, it is expected that the ON current of gallium arsenide (GaAs) is lower than that of silicon (Si) because gallium arsenide (GaAs) has a bandgap (Eg, GaAs=1.43 eV) wider than that of silicon (Si), but as the simulation result shown in FIG. 41, the ON currents of both have almost similar values.

By analyzing the reason, it is found out that the value of ON current is affected by the electron mobility of the channel region after tunneling of electrons as carriers from the source region to the channel region in an n-type TFET.

In other words, although a silicon (Si) device has the number of electrons tunneling from the source region to the channel region more than that of a gallium arsenide (GaAs) device, it is found out that the ON currents of both have almost similar values because the electron mobility ($\mu$e) of the silicon (Si) channel region is 1350 cm$^2$/Vs and 6.3 times less than 8500 cm$^2$/Vs of the electron mobility ($\mu$e) of the gallium arsenide (GaAs) channel region.

In addition, from FIG. 41, it is found out that a tunneling field effect transistor formed by heterojunction of Ge/SiGe/Si as the source/channel/drain regions can have a higher value of ON current than that of a tunneling field effect transistor formed by homojunction of germanium (Ge).

On the other hand, from FIG. 41, it is found out that the OFF current has the lowest value in a gallium arsenide (GaAs) device with a relatively wide bandgap and has the highest value in a germanium (Ge) device with a relatively narrow bandgap.

FIG. 42 is an electrical characteristic view for comparing values of ON and OFF currents of compound tunneling field effect transistors formed by various heterojunctions with a source region of germanium (Ge). From FIG. 41 and as like as Embodiment 3, it is found out that a tunneling field effect transistor formed by heterojunction of Ge/GaAs/GaAs as the source/channel/drain regions can produce the largest ON/OFF current ratio by maximizing the value of ON current and by minimizing the value of OFF current at the same time.

The threshold voltage is defined when the value of drain current is 10-6 A/$\mu$m in FIG. 41 and it is applied to FIG. 42. In the Ge/GaAs/GaAs device of Embodiment 3, the ON current and the ON/OFF current ratio are calculated as 12.77×10-3 A/$\mu$m and 4.96×1015, respectively.

The ON current of the Ge/GaAs/GaAs device of Embodiment 3 has a value 103 times higher than that of the silicon (Si) device and meets the requirement condition suggested in a roadmap of a recent switch device technology.

In addition, from FIG. 42, it is found out that the threshold voltage is shifted toward a right direction in the case of forming the channel region of aluminum gallium arsenide (AlGaAs) by adding aluminum to a gallium arsenide (GaAs) as the second semiconductor material according to Embodiment 3.

The major reason of the threshold voltage shift is that when an electron looks toward the channel region after entering the channel region from the source region by tunneling, the electron feels a higher energy barrier from aluminum gallium arsenide (AlGaAs) than from gallium arsenide (GaAs) because the electron affinity of aluminum gallium arsenide (AlGaAs) is less than that of gallium arsenide (GaAs).

However, from FIG. 42, it is found out that the Ge/GaAs/AlGaAs device added aluminum to only drain region has not a threshold voltage shift greater than that of the Ge/AlGaAs/GaAs device.

To quantitively analyze the threshold voltage shift by adding aluminum to the channel region, in a nano wire TFET structure having a vertical channel of 30 nm length of channel and 10 nm half diameter, the added aluminum ratio to substitute for gallium (Ga) is changed from 0 to 40% in a simulation. The result of the simulation is shown in FIG. 43.

Figure 43:
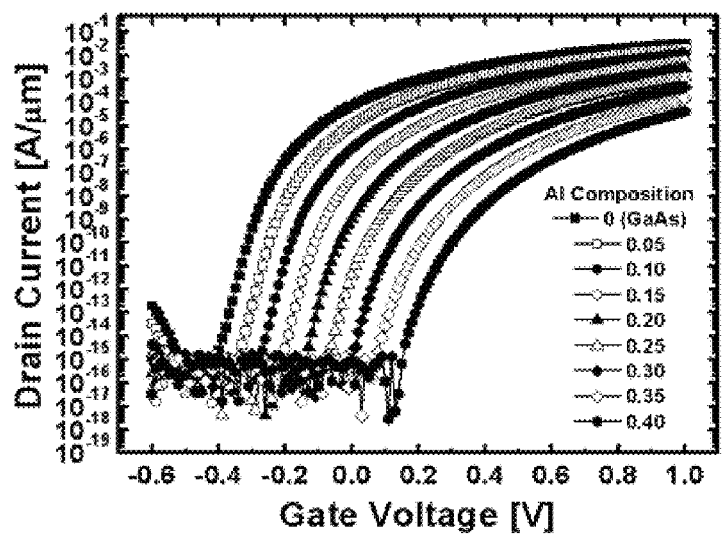
FIG. 43 is an electrical characteristic view showing a threshold voltage shifted to high voltage in a compound tunneling field effect transistor having a channel region formed with aluminum gallium arsenide (AlxGa1-xAs) when the content (x) of aluminum in a channel region is increased.

From FIG. 43, it is found out that the threshold voltage is shifted toward a right direction with an interval by increasing an added aluminum ratio as 5% in each time.

Figure 44:
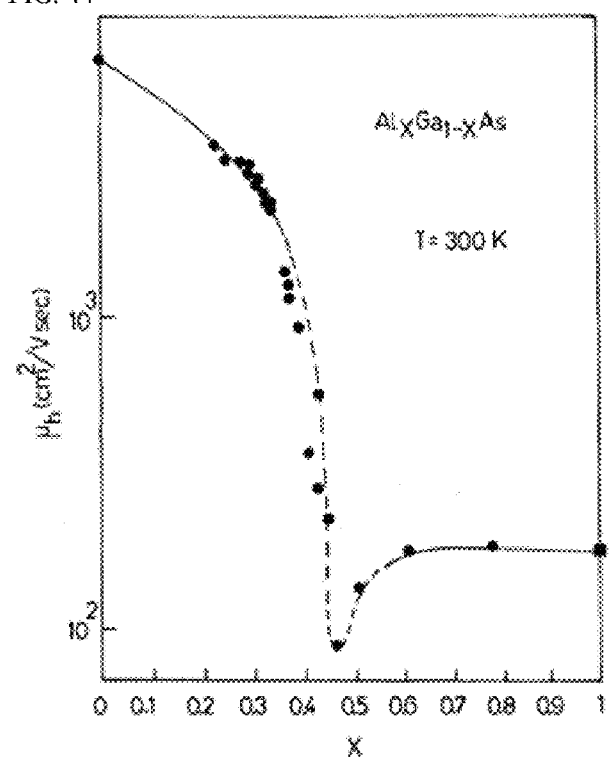
FIG. 44 is an electrical characteristic view showing a change of hole mobility ($\mu h$) when the content (x) of aluminum in a channel region formed with aluminum gallium arsenide (AlxGa1-xAs) is increased.

By considering together with the change of hole mobility (μh) of aluminum gallium arsenide (AlxGa1-xAs) by adding aluminum content (x) as shown in FIG. 44, it is expected that the threshold voltage may be shifted toward a right direction until 0.45 of the aluminum content (x).

When the aluminum content (x) is over 0.45, the property of a ternary compound is lost by following the metal property of aluminum more than gallium (Ga). And it is preferred that the added aluminum content (x) is within 0.45 in aluminum gallium arsenide (AlxGa1-xAs).

Figure 45:
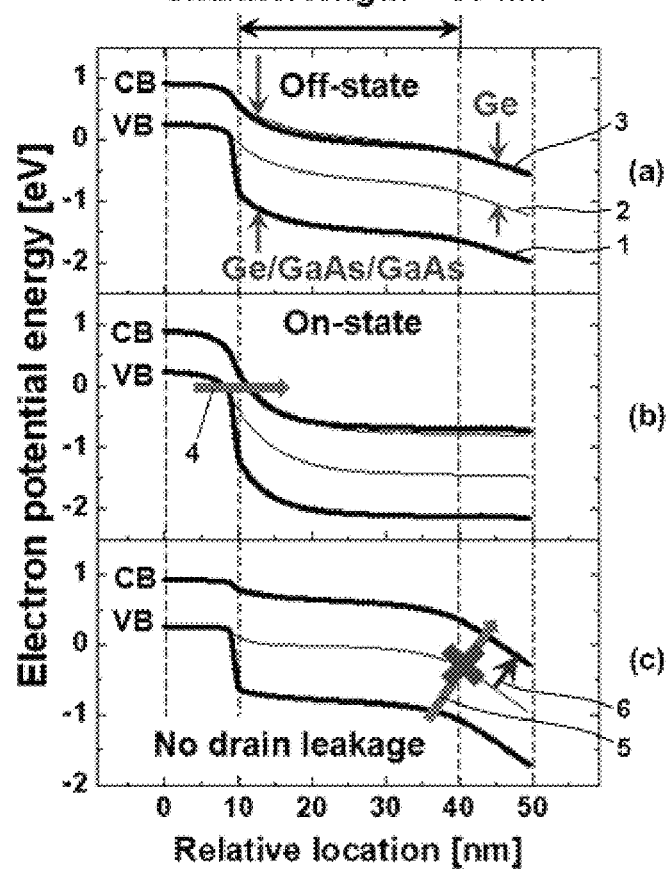
FIG. 45 is a view showing a simulation result for comparing energy band changes under (a) Off state, (b) On state, and (c) a state applied to a gate electrode with a negative voltage between tunneling field effect transistors formed with a homojunction of germanium (Ge)/germanium (Ge)/germanium (Ge) and a heterojunction of germanium (Ge)/gallium arsenide (GaAs)/gallium arsenide (GaAs) in source/channel/drain regions, respectively.

FIG. 45 is a view showing a simulation result for comparing energy band changes under (a) Off state, (b) On state, and (c) a state applied to a gate electrode with a negative voltage between a tunneling field effect transistor formed by a homojunction of germanium (Ge)/germanium (Ge)/germanium (Ge) and a tunneling field effect transistor formed by a heterojunction of germanium (Ge)/gallium arsenide (GaAs)/gallium arsenide (GaAs) according to Embodiment 3 in source/channel/drain regions, respectively.

As known in FIG. 45, when a reverse bias voltage is applied between the source and drain regions (e.g., a negative voltage to P+ source region and a positive voltage to N+ drain region), if the gate electrode is additionally supplied with a positive voltage higher than the threshold voltage, the energy band is shifted from (a) Off state to (b) On state.

As shown in FIG. 45(b), when the gate electrode is supplied with the positive voltage higher than the threshold voltage, the driving current is flowing as the ON current 4 by tunneling electrons in valence band (VB) of the source region to conduction band (CB) of the channel region through a rapid band slope of abrupt heterojunction between the germanium (Ge) source region and the gallium arsenide (GaAs) drain region according to Embodiment 3.

On the other hand, as shown in FIG. 45(c), when a negative voltage is applied to the gate electrode, the potential energy of electron in the channel region is increased. As a result, it happens to be a band slope in the junction between the channel and drain regions.

At this time, since the band width of the gallium arsenide (GaAs)/arsenide (GaAs) junction of Embodiment 3 is larger than that of germanium (Ge) device, the probability for tunneling electrons in the valence band (VB) 1 of the channel region to the conductive band (CB) 3 of the drain region of the device according to Embodiment 3 is less than that for tunneling electrons in the valence band (VB) 2 of the channel region to the conductive band (CB) 3 of the drain region of the germanium (Ge) device. As a result, the leakage current 5 of the device according to Embodiment 3 can be more reduced than that 6 of the germanium (Ge) device.

Therefore, at the switch-Off time, namely, when it do not apply a driving voltage to the gate electrode or, as mentioned above, be supplied with an opposite polarity voltage (e.g., a negative voltage) to that of a voltage supplied at driving time, to restrain the unintended tunneling in the interface of junction between the channel and drain regions to the utmost, it is preferred that as like as Embodiment 3, the drain region is formed with a material as the same as the channel region material having a bandgap wider than that of the source region or with a material having a bandgap wider than that of the second semiconductor material of the channel region.

[Embodiment 4 on a Device Structure]

Figure 39:
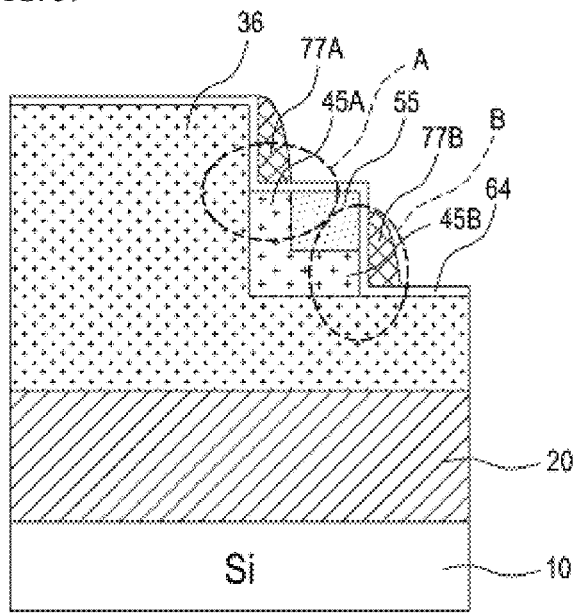
Figure 40:
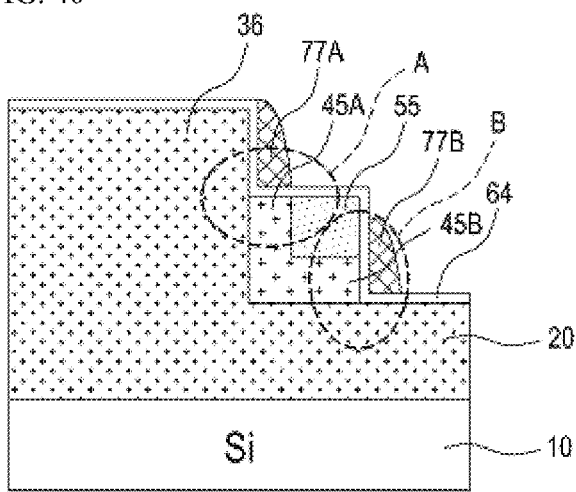
FIG. 40 is a process cross-sectional view showing a structure of a compound tunneling field effect transistor and a fabrication process according to the other embodiment of the present invention.

A compound tunneling field effect transistor according to Embodiment 4 of the present invention, as commonly shown in FIGS. 39 and 40, basically comprising: a common source region 36 formed in a stair shape having at least vertical and horizontal planes one side thereof and formed of a first semiconductor material having a first conductive type on a predetermined substrate 10; a common channel region 45A or 45B formed in an 'L' shape on the vertical and horizontal planes of the common source region 36 and formed of a second semiconductor material having a lattice constant difference with the first semiconductor material 2% or less, a bandgap wider than that of the first semiconductor material and electron mobility at least 5 times higher than that of silicon; a common drain region 55 formed with a specific interval from the vertical and horizontal planes of the common source region 36, respectively, and formed of a third semiconductor material having a lattice constant difference with the second semiconductor material 1% or less, a bandgap wider than or equal to that of the second semiconductor material and a second conductive type opposite to the first conductive type on the common channel region 45A or 45B; a first gate electrode 77A formed on a first gate dielectric layer 64 interlaid on an upper part of the vertical plane of the common source region 36 and on the common channel region 45A; and a second gate electrode 77B formed on a second gate dielectric layer 64 interlaid on the sidewalls of the common drain and channel regions 55 and 45B and on one side of the horizontal plane of the common source region 36, wherein horizontal and vertical channels are formed on both ends 45A and 45B of the common source region 36.

In other words, the device A having the horizontal channel and the device B having the vertical channel are simultaneously embodied by forming the common channel region 45A or 45B and the common drain region 55 at the corner of the common source region 36 in a stair shape having vertical and horizontal planes at least one side thereof, and by forming the first and second gate electrodes 77A and 77B on the gate dielectric layer 64 interlaid on both ends 45A and 45B of the common channel, respectively.

By the above configuration, it can be used as a device with a plurality of functions because the driving current of drain is controlled by the first gate electrode 77A and the second gate electrode 77B.

In addition, since the properties of the each material of the common source region 36, the common channel region 45A or 45B, and the common drain region 55 are equal to that of the compound tunneling field effect transistor according to Embodiment 1, it has the same effects as mentioned above.

Moreover, it can comprise, wherein: the substrate 10 is a silicon substrate, a buffer layer 20 is further formed of silicon germanium (SiGe) between the substrate 10 and the common source region 36, the first semiconductor material is germanium (Ge), and the second and third semiconductor materials are gallium arsenide (GaAs). By the above configuration, the effects is same as the above mentioned effects described in the compound tunneling field effect transistor according to Embodiment 3.

Of cause, in Embodiment 4, the common channel region 45A or 45B could be formed of aluminum gallium arsenide (AlxGa1-xAs) added aluminum to the second semiconductor material for shifting simultaneously the threshold voltages of the device A having the horizontal channel and the device B having the vertical channel. At this time, the content (x) of aluminum can be in a range of $0 < x \leq 0.45$.

[Embodiment 5 on a Fabrication Method of Device]

The fabrication method according to Embodiment 5 of the present invention is related to the compound tunneling field effect transistor having a vertical channel and is provided below with respect to FIGS. 4 to 16.

Figure 5:
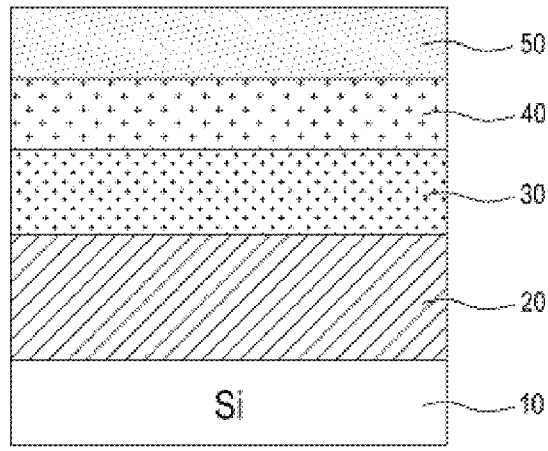

First, as shown in FIG. 5, a first semiconductor layer 30 having a bandgap at least 0.4 electron volts (eV) narrower than that of a silicon substrate 10 is epitaxially grown by in situ doping of a dopant having a first conductive type (e.g., P type) on the silicon substrate 10 (a first step).

Here, since the first semiconductor layer 30 has to be epitaxially grown on the silicon substrate 10 and formed by a material having a bandgap at least 0.4 electron volts (eV) narrower than that of the silicon substrate 10, it is preferred to be formed of germanium (Ge) as the material.

Figure 4:
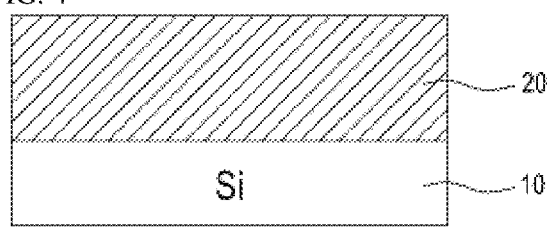
FIGS. 4 to 10 are process cross-sectional views showing a structure of a compound tunneling field effect transistor and a fabrication process according to an embodiment of the present invention.

Although germanium (Ge) can be epitaxially grown as the first semiconductor layer 30 directly on the silicon substrate 10, it is preferred that first, a buffer layer 20, as shown in FIG. 4, is epitaxially grown with silicon germanium (SiGe) and then germanium (Ge) is epitaxially grown on the buffer layer 20 for the homogeneous first semiconductor layer 30.

Next, as shown in FIG. 5, the second semiconductor layer 40 having a bandgap wider than that of the first semiconductor layer 30 and electron mobility at least 5 times higher than that of the silicon substrate 10 is epitaxially grown on the first semiconductor layer 30 (a second step).

Here, since the second semiconductor layer 40 has to be epitaxially grown on the first semiconductor layer 30 and have a bandgap wider than that of the first semiconductor layer 30 and electron mobility at least 5 times higher than that of the silicon substrate 10, it is preferred to be formed of gallium arsenide (GaAs) when germanium (Ge) is used to form the first semiconductor layer 30.

As the above mentioned in Embodiment 3, the reasons are that the lattice constant of gallium arsenide (GaAs) is 5.65 Å and equal to that of germanium (Ge) for forming a homogeneous epitaxial layer, a bandgap (Eg, GaAs=1.43 eV) of gallium arsenide (GaAs) is wider than a bandgap (Eg, Ge=0.67 eV) of germanium (Ge), and the electron mobility of gallium arsenide (GaAs) is 8500 $cm^2/Vs$ and 6.3 times higher than 1350 $cm^2/Vs$ of the silicon (Si).

In addition, since the second semiconductor layer 40 will be formed as a channel region, the threshold voltage can be shifted by forming aluminum gallium arsenide (AlxGa1-xAs) in the epitaxial growing of gallium arsenide (GaAs) by adding some aluminum.

Because the level of shifted threshold voltage is depended on the added content (x) of aluminum, as shown in FIGS. 43 and 44, it is preferred that the content (x) of aluminum is controlled in a range of 0<x≤0.45.

Therefore, according to Embodiment 5, TFET switch devices having various threshold voltages can be also easily fabricated by controlling the added content (x) of aluminum in the optical device fabrication process.

Next, as shown in FIG. 5, a third semiconductor layer 50 having a bandgap wider than or equal to that of the second semiconductor layer 40 is epitaxially grown by in situ doping of a dopant having a second conductive type (e.g., N type) opposite to the first conductive type on the second semiconductor layer 40 (a third step).

Here, since the third semiconductor layer 50 has to be epitaxially grown on the second semiconductor layer 40 and have a bandgap wider than or equal to that of the second semiconductor layer 40, when the second semiconductor layer 40 is formed of gallium arsenide (GaAs), it is preferred to use the same material as gallium arsenide (GaAs). For shifting the threshold voltage, in case that the second semiconductor layer 40 is formed of aluminum gallium arsenide (AlGaAs), it is preferred that the third semiconductor layer 50 is formed of gallium arsenide (GaAs).

Figure 6:
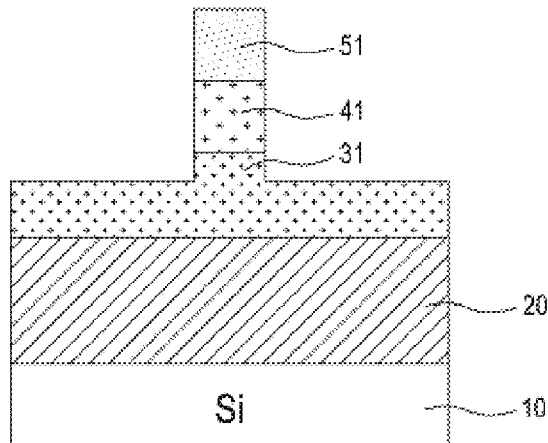
Figure 13:
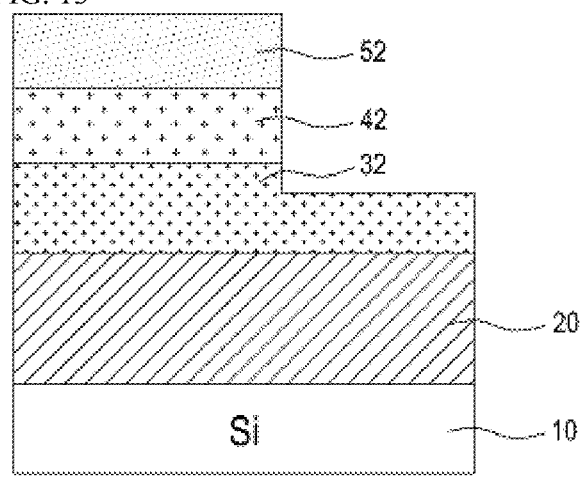
FIGS. 13 to 16 are process cross-sectional views showing a structure of a compound tunneling field effect transistor and a fabrication process according to another embodiment of the present invention.

Next, as shown in FIG. 6 or 13, a drain region 51 or 52, a channel region 41 or 42 and a source region 31 or 32 are formed by etching the third semiconductor layer 50, the second semiconductor layer 40 and the first semiconductor layer 30, respectively (a fourth step).

Here, as shown in FIG. 6, the etching of the third semiconductor layer 50, the second semiconductor layer 40 and the first semiconductor layer 30 can be sequentially carried out until a part of the first semiconductor layer 30 is etched and a pillar shape is projected to form the drain region 51, the channel region 41 and the source region 31, respectively, from the upper part of the pillar shape.

Or, as shown in FIG. 13, the etching of the third semiconductor layer 50, the second semiconductor layer 40 and the first semiconductor layer 30 can be sequentially carried out until a part of the first semiconductor layer 30 is etched and a mesa structure having a sidewall on one side thereof is projected to form the drain region 52, the channel region 42 and the source region 32, respectively, from the upper part of the mesa structure.

Figure 7:
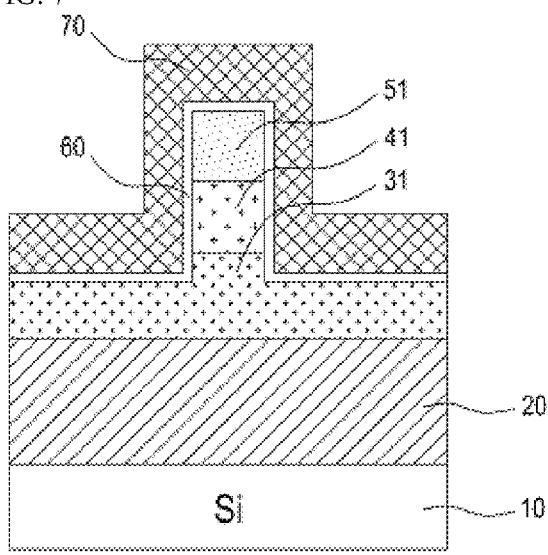
Figure 14:
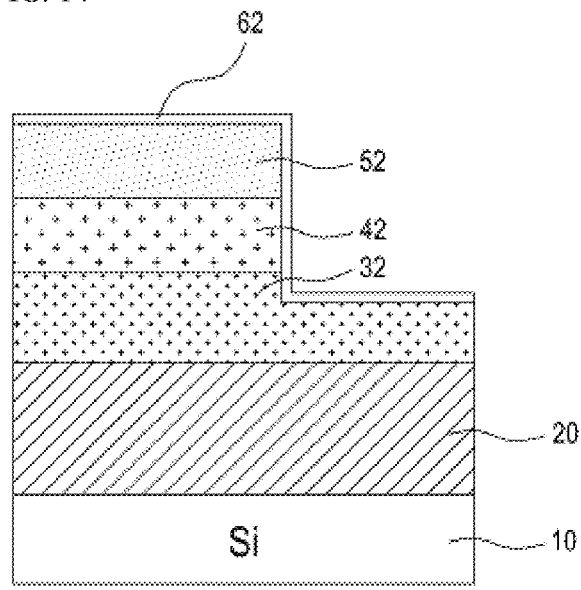
Figure 15:
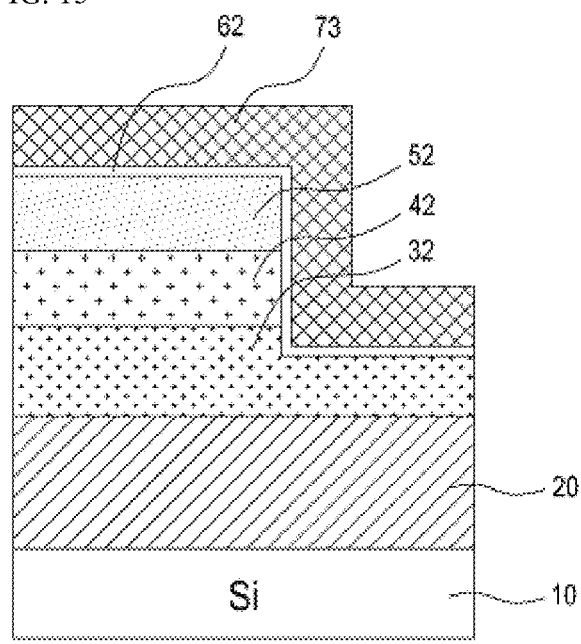

Next, as shown in FIG. 7 or 14, a gate dielectric layer 60 or 62 is formed on the drain region 51 or 52, the channel region 41 or 42 and the source region 31 or 32 (a fifth step) and, as shown in FIG. 8 or 16, a gate electrode 71, 72 or 74 is formed by deposing and etching a gate material 70 or 73 on the gate dielectric layer 60 or 62 (a sixth step).

The etching of the gate material 70 or 73, as shown in FIG. 16, can be carried out to form the gate electrode 74 on the gate dielectric layer 62 formed on the sidewall of the mesa structure, or, as shown in FIG. 8, can be carried out to form two gate electrodes, namely, double gate electrodes 71 and 72 on the gate dielectric layer 62 formed on both sidewalls of the pillar shape or one gate electrode wrapped on one sidewall or all sidewalls.

FIG. 9 shows a planarization of an insulating layer 80 covered on the structure shown in FIG. 8. FIG. 10 shows a contact plug 92, 94, 96 or 98 formed by filling a conductive material into contact holes for contacting the source region 31/channel region 41/drain region 51.

FIGS. 11 and 12 show exemplaries of contact structures that can be seen by viewing FIG. 10 from an upper side.

FIG. 11 shows a contact structure in the case of the GAA (Gate-All-Around) structure of the gate electrode 71 or 72 formed to wrap all sidewalls of the projected pillar shape shown in FIG. 8. The reference number 92 indicates a source region contact plug, 94 a gate electrode contact plug and 98 a drain region contact plug, respectively.

On the other hand, FIG. 12 shows a contact structure in the case of the double gate electrode structure of the gate electrodes 71 and 72 formed on both sidewalls of the projected pillar shape shown in FIG. 8. The reference number 92 indicates the source region contact plug, 94 and 96 gate electrode contact plugs and 98 a drain region contact plug, respectively.

[Embodiment 6 on Fabricating Method of a Device]

The fabrication method according to Embodiment 6 of the present invention is related to the compound tunneling field effect transistor having a horizontal channel and is provided below with respect to FIGS. 17 to 21.

Figure 17:
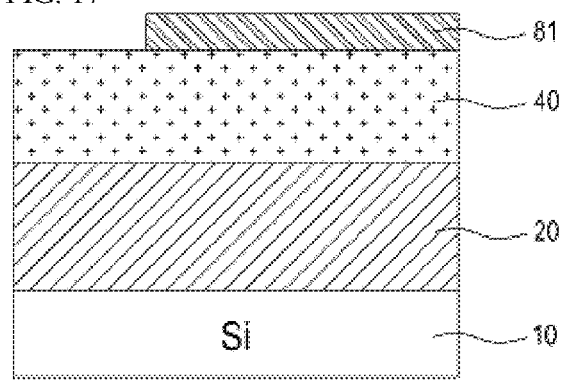
FIGS. 17 to 21 are process cross-sectional views showing a structure of a compound tunneling field effect transistor and a fabrication process according to another embodiment of the present invention.

First, as shown in FIG. 17, a channel region is formed by epitaxially growing a second semiconductor layer 40 having electron mobility at least 5 times higher than that of a silicon substrate on the silicon substrate 10 (a first step).

Here, since the second semiconductor layer 40 has to be epitaxially grown on the silicon substrate 10 and have the electron mobility at least 5 times higher than that of the silicon substrate 10, it is preferable to be formed of gallium arsenide (GaAs).

The reasons, as above mentioned in Embodiment 3, are that gallium arsenide (GaAs) has 5.65 Å as a lattice constant, can be epitaxially grown as like germanium (Ge) directly on the silicon substrate 10, and has 8500 cm$^2$/Vs as electron mobility which is 6.3 times higher than 1350 cm$^2$/Vs of the silicon (Si).

Although gallium arsenide (GaAs) can be epitaxially grown directly on the silicon substrate 10, it is preferred that first, a buffer layer 20, as shown in FIG. 17, is epitaxially grown with silicon germanium (SiGe) and then gallium arsenide (GaAs) is epitaxially grown on the buffer layer 20 for the homogeneous second semiconductor layer 40.

In addition, the second semiconductor layer 40 will be functioned as a channel region, the threshold voltage can be shifted by forming aluminum gallium arsenide (AlxGa1-xAs) in the epitaxial growing of gallium arsenide (GaAs) by adding some aluminum.

Because the level of shifted threshold voltage is depended on the added content (x) of aluminum, as shown in FIGS. 43 and 44, it is preferred that the content (x) of aluminum is controlled in a range of 0<x≤0.45.

Therefore, TFET switch device having various threshold voltages can be also easily fabricated by controlling the added content (x) of aluminum in the optical device fabrication process.

Figure 18:
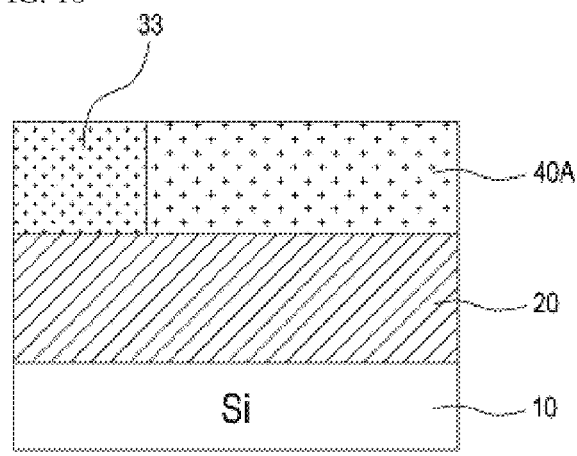

Next, as shown in FIG. 17, a first mask 81 is formed on the second semiconductor layer 40, as shown in FIG. 18, one side of the second semiconductor layer 40 is etched by using the first mask 81 and with in situ doping of a dopant having a first conductive type (e.g., P type), a first semiconductor layer 33 having a bandgap at least 0.4 electron volts (eV) narrower than that of the silicon substrate 10 is epitaxially grown to form a source region (a second step).

Here, since the first semiconductor layer 33 has to be epitaxially grown on the silicon substrate 10 and have a bandgap at least 0.4 electron volts (eV) narrower than that of the silicon substrate 10, it is preferred to be formed of germanium (Ge).

When the buffer layer 20 is formed of silicon germanium (SiGe) on the silicon substrate 10, the homogeneous first semiconductor layer 33 is formed by epitaxial growing of germanium (Ge) on the buffer layer 20.

Of cause, the first mask 81 can be formed to hide the channel and source regions and the second semiconductor layer 40 can be firstly etched to form a drain region as mentioned below.

Figure 19:
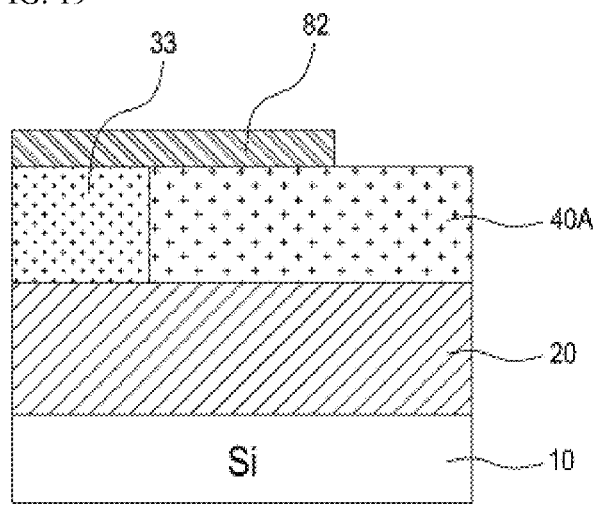
Figure 20:
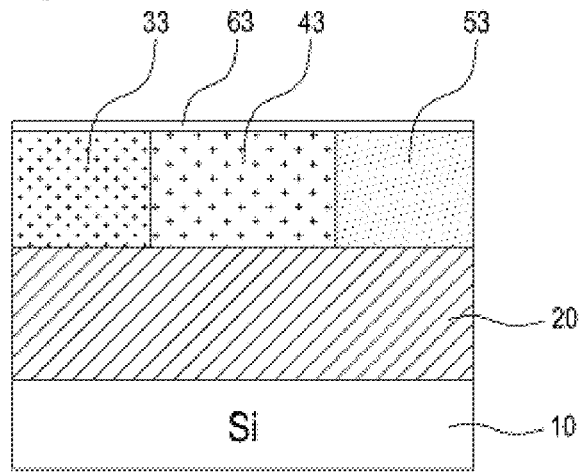

Next, as shown in FIG. 19, a second mask 82 is formed on the first semiconductor layer 33 and the second semiconductor layer 40A, as shown in FIG. 20, other side of the second semiconductor layer 40A is etched by using the second mask 82 and with in situ doping of a dopant having a second conductive type (e.g., N type) opposite to the first conductive type, a third semiconductor layer 53 having a bandgap wider than or equal to that of the second semiconductor layer 40A is epitaxially grown to form a drain region (a third step).

Here, since the third semiconductor layer 53 has to be epitaxially grown on the silicon substrate 10 and have a bandgap wider than or equal to that of the second semiconductor layer 40A, when the second semiconductor layer 40A is formed of gallium arsenide (GaAs), it is preferred to form the third semiconductor layer 53 with gallium arsenide (GaAs).

When the buffer layer 20 is formed of silicon germanium (SiGe), the homogeneous third semiconductor layer 53 is formed by epitaxial growing of gallium arsenide (GaAs) on the buffer layer 20.

Next, as shown in FIG. 19, a gate dielectric layer 63 is formed on the source region 33, the channel region 43 and the drain region 53 (a fourth step) and, as shown in FIG. 20, a gate electrode 75 is formed by depositing and etching a gate material on the gate dielectric layer 63 (a fifth step).

[Embodiment 7 on Fabricating Method of a Device]

The fabrication method according to Embodiment 7 of the present invention is related to the compound tunneling field effect transistor using a sidewall of a source region and is provided below with respect to FIGS. 22 to 40.

Figure 22:
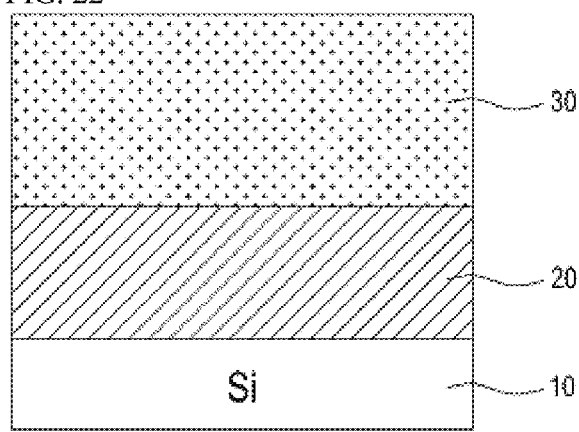
FIGS. 22 to 27 are process cross-sectional views showing a structure of a compound tunneling field effect transistor and a fabrication process according to another embodiment of the present invention.
Figure 23:
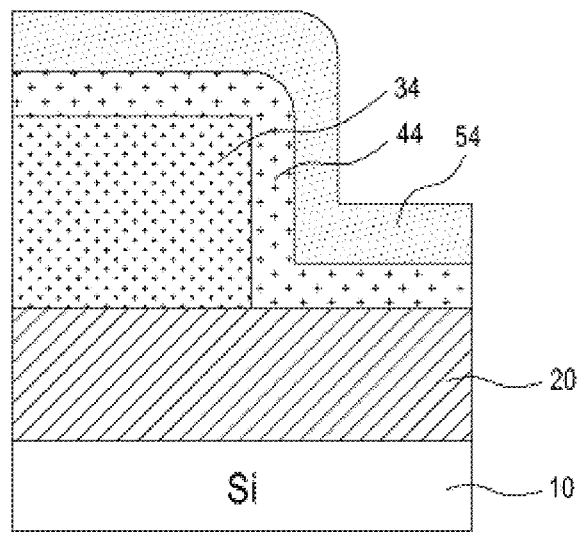
Figure 28:
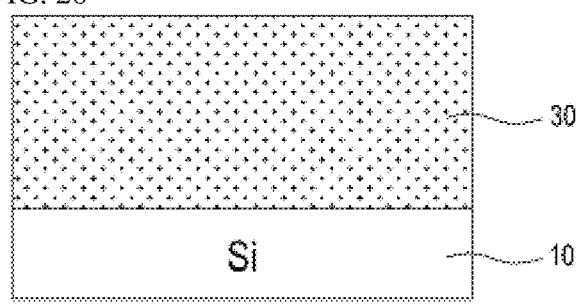
FIGS. 28 to 33 are process cross-section views showing a structure of a compound tunneling field effect transistor and a fabrication process according to another embodiment of the present invention.
Figure 29:
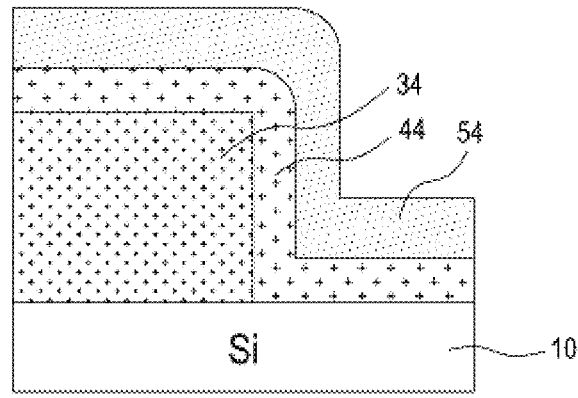
Figure 34:
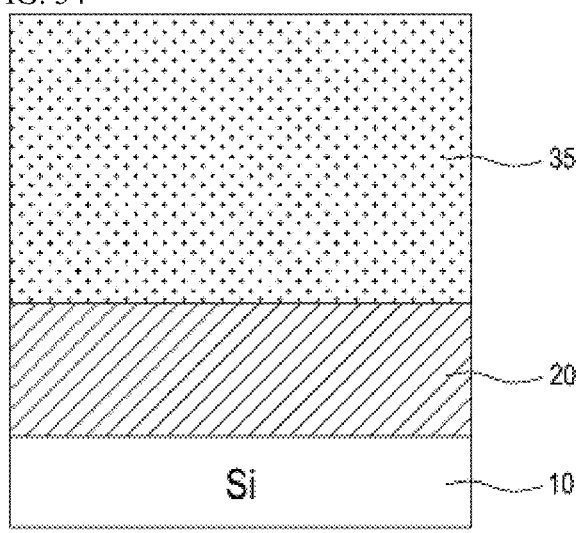
FIGS. 34 to 39 are process cross-section views showing a structure of a compound tunneling field effect transistor and a fabrication process according to another embodiment of the present invention.
Figure 35:
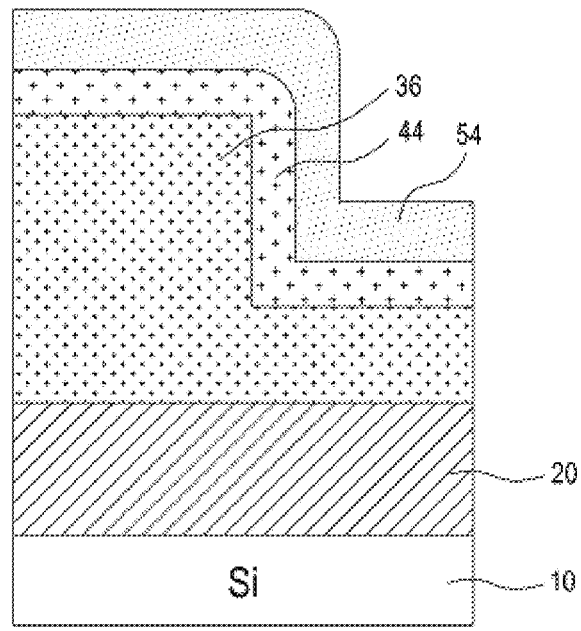

First, as shown in FIG. 22, 28 or 34, a first semiconductor layer 30 or 35 having a bandgap at least 0.4 electron volts (eV) narrower than that of a silicon substrate 10 is, with in situ doping of a dopant having a first conductive type (e.g., P type), epitaxially grown on the silicon substrate 10, and, as shown in FIG. 23, 29 or 35, is etched to form a source region having a projected mesa structure (a first step).

Here, since the first semiconductor layer 30 or 35 has to be epitaxially grown on the silicon substrate 10 and have a bandgap at least 0.4 electron volts (eV) narrower than that of the silicon substrate 10, it is preferred to be formed of germanium (Ge).

As shown in FIGS. 28 and 40, though the germanium (Ge) can be epitaxially grown on the first semiconductor layer 30 or 35 directly on the silicon substrate 10, it is preferred that first, a buffer layer 20, as shown in FIGS. 22 and 34, is epitaxially grown with silicon germanium (SiGe) and then germanium (Ge) is epitaxially grown on the buffer layer 20 for the homogeneous first semiconductor layer 30 or 35.

As shown in FIG. 23, 29 or 35, one side of the first semiconductor layer 30 or 35 is etched to form the projected other side of the first semiconductor layer 30 or 35 which resulted to a mesa structure with a plain top side and a vertical sidewall on at least one side thereof on the silicon substrate 10 or the buffer layer 20 and used to as a source region 34.

Figure 24:
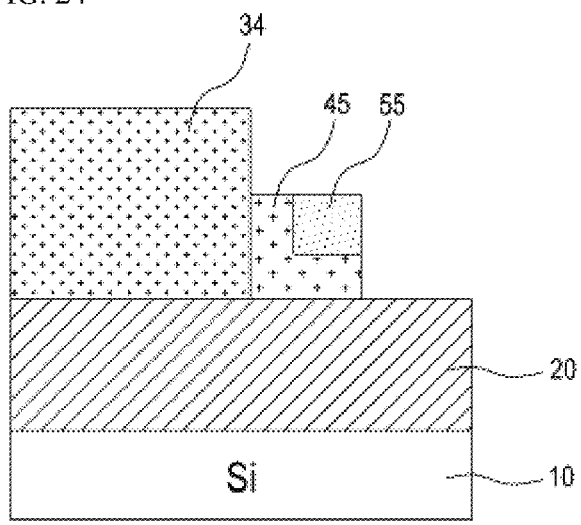
Figure 30:
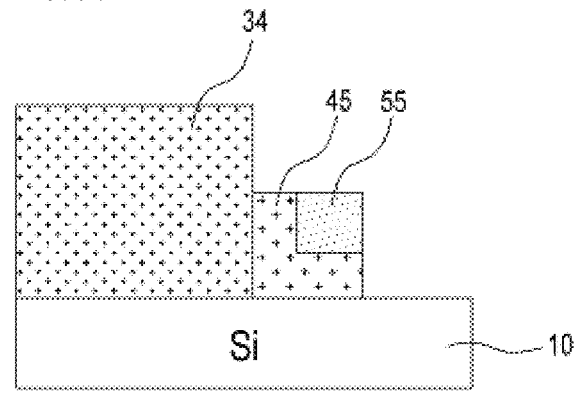
Figure 36:
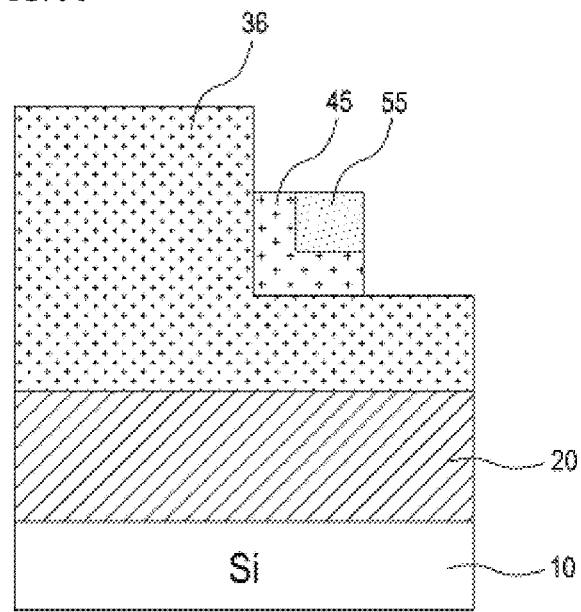

Here, according to the etching amount of the first semiconductor 30 or 35, as shown in FIG. 23 or 29, the mesa structure can be formed to expose the silicon substrate 10 or the buffer layer 20 and, as shown in FIG. 35, the first semiconductor layer 35 can be etched by a specific depth to form a stair shape having vertical and horizontal planes at least on one side thereof Next, as shown in FIG. 23, 29 or 35, a second semiconductor layer 44 having electron mobility at least 5 times higher than that of the silicon substrate 10 is epitaxially grown on the projected source region 34 or 36, with in situ doping by a dopant having a second conductive type (e.g., N type) opposite to the first conductive type, a third semiconductor layer 54 having a bandgap wider than or equal to that of the second semiconductor layer 44 is epitaxially grown on the second semiconductor layer 44, and as shown in FIG. 24, 30 or 36, the third semiconductor layer 54 and the second semiconductor layer 44 are etched by anisotropy to form a drain region 55 and a channel region 45, respectively (a second step).

Here, since the second semiconductor layer 44 has to be epitaxially grown on the source region 34 or 36, the silicon substrate 10 or the buffer layer 20, and have an bandgap wider than that of the material of the source region 34 or 36 and electron mobility at least 5 times higher than that of the silicon substrate 10, when the source region 34 or 36 is formed of germanium (Ge), it is preferred to be formed of gallium arsenide (GaAs).

The reasons, as above mentioned in Embodiment 3, are that the lattice constant of gallium arsenide (GaAs) is 5.65 521, is equal to that of germanium (Ge) and differs about 4% from that of silicon (Si) to form a homogeneous epitaxial layer, a bandgap (Eg, GaAs=1.43 eV) of gallium arsenide (GaAs) is wider than a bandgap (Eg, Ge=0.67 eV) of germanium (Ge), and the electron mobility of gallium arsenide (GaAs) is 8500 cm$^2$/Vs and 6.3 times higher than 1350 cm$^2$/Vs of the silicon (Si).

In addition, since the second semiconductor layer 44 will be functioned as the channel region, the threshold voltage can be shifted by forming aluminum gallium arsenide (AlxGal-xAs) in the epitaxial growing of gallium arsenide (GaAs) by adding some aluminum.

Because the level of shifted threshold voltage is depended on the added content (x) of aluminum, as shown in FIGS. 43 and 44, it is preferred that the content (x) of aluminum is controlled in a range of 0<x≤0.45.

Therefore, TFET switch devices having various threshold voltages can be also easily formed by controlling the added content (x) of aluminum in the optical device fabrication process.

Here, since the third semiconductor layer 54 has to be epitaxially grown on the second semiconductor layer 44 and have a bandgap wider than or equal to that of the second semiconductor layer 44, when the second semiconductor layer 44 is formed of gallium arsenide (GaAs), it is preferred to form the third semiconductor layer 54 with gallium arsenide (GaAs). To shift the threshold voltage, when the second semiconductor layer 44 is formed of aluminum gallium arsenide (AlGaAs), it is preferred to form the third semiconductor layer 54 with gallium arsenide (GaAs).

As the structure shown in FIG. 23 or 29, the third semiconductor layer 54 and the second semiconductor layer 44 are etched by anisotropy to form, as shown in FIG. 24 or 30, the channel region 45 on the lower sidewall of the mesa structure 34 and the drain region 55 on the channel region 45.

On the other hand, as the structure shown in FIG. 35, the third semiconductor layer 54 and the second semiconductor layer 44 are etched by anisotropy to form, as shown in FIG. 36, the channel region 45 in an 'L' shape on the vertical and horizontal planes of the source region 36 and the drain region 55 with an interval from the vertical and horizontal planes of the source region 36, respectively.

Figure 25:
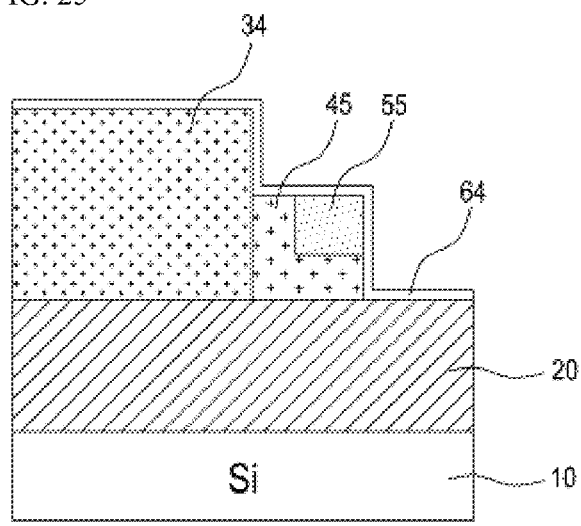
Figure 26:
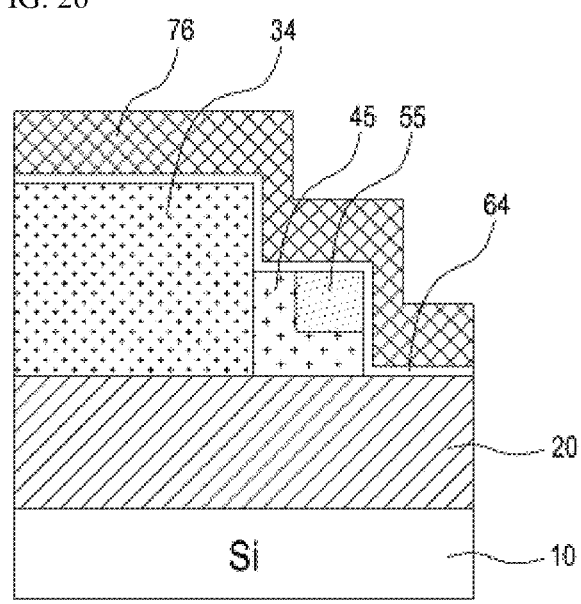
Figure 31:
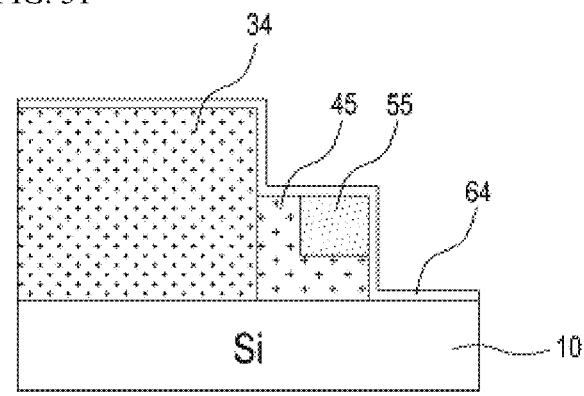
Figure 32:
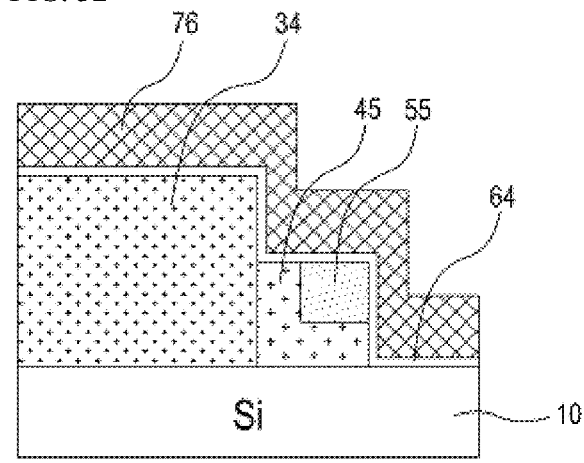
Figure 37:
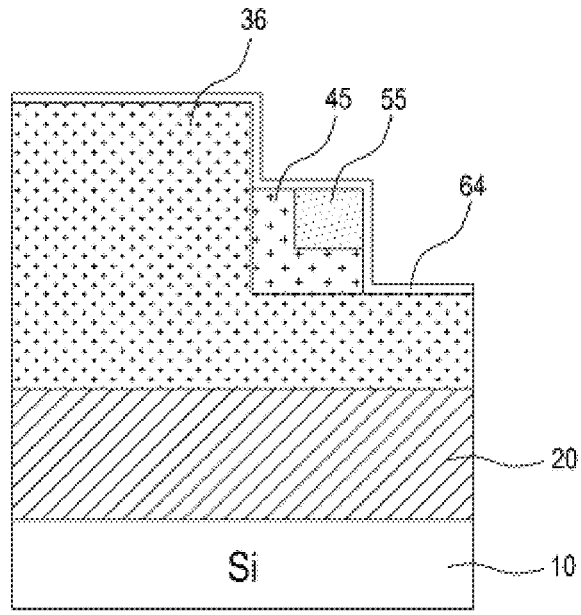
Figure 38:
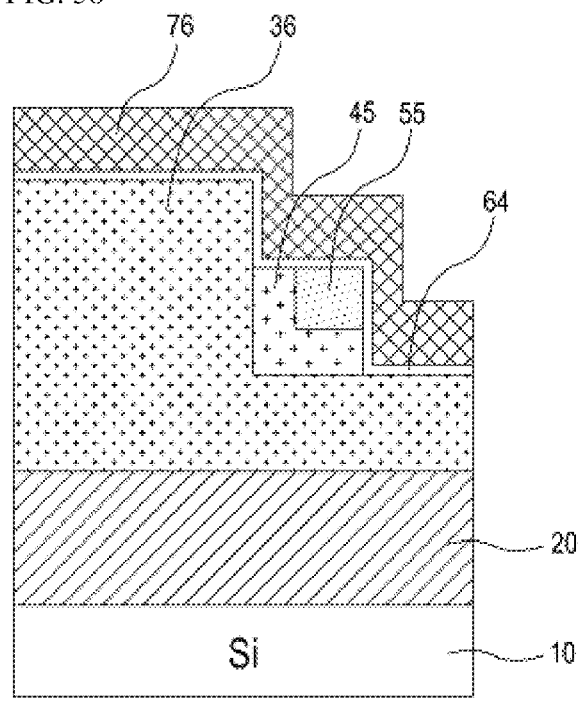

Next, as shown in FIG. 25, 31 or 37, a gate dielectric layer 64 is formed on the source region 34 or 36, the channel region 45 and the drain region 55 (a third step), and, as shown in FIG. 26, 32 or 38, a gate material 76 is deposited and etched on the gate dielectric layer 64 to form, as shown in FIG. 27, 33 or 39, a gate electrode 77, 77A or 77B (a fourth step).

In the first step, when the etching of the first semiconductor layer 30, as shown in FIG. 23 or 29, exposes the silicon substrate 10 or the buffer layer 20, the gate electrode 77, as shown in FIG. 27 or 33, is formed over the upper sidewall of the mesa structure interlaid with the gate dielectric layer 64 formed on the source region 34 and the channel region 45. As a result, a device A having a horizontal channel is formed.

On the other hand, in the first step, when the first semiconductor layer 35, as shown in FIG. 35, is etched by a specific depth to form a stair shape having vertical and horizontal planes on one side thereof, the gate electrode, as shown in FIG. 39, is formed as a first gate electrode 77A with an interlaying gate dielectric layer 64 on an upper side of the vertical plane of the source region 36 and on the channel region 45A to form a device A having a horizontal channel and simultaneously, formed as a second gate electrode 77B on the gate dielectric layer 64 formed on the sidewalls of the drain region 55 and the channel region 45B and on one side of the horizontal plane of the source region 36 to form a device B having a vertical channel.

In the later case, the compound tunneling field effect transistor according to Embodiment 4 can be fabricated by one process. In other words, the device A having a horizontal channel and the device B having a vertical channel can be simultaneously embodied by forming the common channel region 45A or 45B and the common drain region 55 at the corner of the common source region 36 in the stair shape having the vertical and horizontal planes at least on one side thereof and by forming the first and second gate electrodes 77A and 77B on the gate dielectric layer 64 formed on both ends 45A and 45B of the common channel, respectively.

Industrial Applicability

The present invention is related to compound tunneling field effect transistors integrated on a silicon substrate and methods for fabricating the same, and it is substituted not only the conventional MOSFET switch devices of the optical integrated system based on a silicon substrate, but also core circuit components of various kinds of the electrical system. Thus, it has an industrial usefulness.

The invention claimed is:

1. A compound tunneling field effect transistor comprising:
   a silicon substrate;
   a source region formed of a first semiconductor material having a lattice constant difference with silicon 5% or less, a bandgap at least 0.4 electron volts (eV) narrower than that of silicon and a first conductive type on the silicon substrate;
   a channel region formed of a second semiconductor material having a lattice constant difference with the first semiconductor material 2% or less, a bandgap wider than that of the first semiconductor material and electron mobility at least 5 times higher than that of silicon on the source region;
   a drain region formed of a third semiconductor material having a lattice constant difference with the second semiconductor material 1% or less, a bandgap wider than or equal to that of the second semiconductor material and a second conductive type opposite to the first conductive type on the channel region;
   a gate dielectric layer formed on a sidewall of the channel region; and
   a gate electrode formed on the gate dielectric layer, wherein a vertical channel is further included.

2. The compound tunneling field effect transistor of claim 1, wherein:
   a part of the source region, the channel region and the drain region are projected with a pillar shape on the silicon substrate,
   the gate dielectric layer is formed to wrap the pillar shape, and
   the gate electrode is formed to wrap one sidewall, both sidewalls or all sidewalls of the pillar shape on the gate dielectric layer.

3. The compound tunneling field effect transistor of claim 1, wherein:
   a part of the source region, the channel region and the drain region are projected with a mesa structure on the silicon substrate,
   the gate dielectric layer is formed on the mesa structure, and
   the gate electrode is formed over a sidewall of the mesa structure being separated by the gate dielectric layer.

4. The compound tunneling field effect transistor of claim 1, wherein:
   a buffer layer is further formed of silicon germanium (SiGe) between the silicon substrate and the source region,
   the first semiconductor material is germanium (Ge), and
   the second and third semiconductor materials are gallium arsenide (GaAs).

5. The compound tunneling field effect transistor of claim 4, wherein the channel region is formed of aluminum gallium arsenide ($Al_xGa_{1-x}As$) adding aluminum to the second semiconductor material.

6. The compound tunneling field effect transistor of claim 5, wherein the content (x) of aluminum is $0<x\leq0.45$.

7. The compound tunneling field effect transistor of claim 2, wherein:
   a buffer layer is further formed of silicon germanium (SiGe) between the silicon substrate and the source region,
   the first semiconductor material is germanium (Ge), and
   the second and third semiconductor materials are gallium arsenide (GaAs).

8. The compound tunneling field effect transistor of claim 7, wherein the channel region is formed of aluminum gallium arsenide ($Al_xGa_{1-x}As$) adding aluminum to the second semiconductor material.

9. The compound tunneling field effect transistor of claim 8, wherein the content (x) of aluminum is $0<x\leq0.45$.

10. The compound tunneling field effect transistor of claim 3, wherein:
    a buffer layer is further formed of silicon germanium (SiGe) between the silicon substrate and the source region,
    the first semiconductor material is germanium (Ge), and
    the second and third semiconductor materials are gallium arsenide (GaAs).

11. The compound tunneling field effect transistor of claim 10, wherein the channel region is formed of aluminum gallium arsenide ($Al_xGa_{1-x}As$) adding aluminum to the second semiconductor material.

12. The compound tunneling field effect transistor of claim 11, wherein the content (x) of aluminum is $0<x\leq0.45$.

13. A compound tunneling field effect transistor comprising:
    a silicon substrate;
    a source region formed of a first semiconductor material having a lattice constant difference with silicon 5% or less, a bandgap at least 0.4 electron volts (eV) narrower than that of silicon and a first conductive type on the silicon substrate;
    a channel region formed of a second semiconductor material having a lattice constant difference with the first semiconductor material 2% or less, a bandgap wider than that of the first semiconductor material and electron mobility at least 5 times higher than that of silicon being contacted laterally to the source region;
    a drain region formed of a third semiconductor material having a lattice constant difference with the second semiconductor material 1% or less, a bandgap wider than or equal to that of the second semiconductor material and a second conductive type opposite to the first conductive type having a horizontal interval from the source region and being contacted to the channel region;
    a gate dielectric layer formed on the channel region; and
    a gate electrode formed on the gate dielectric layer,
    wherein a horizontal channel is further included.

14. The compound tunneling field effect transistor of claim 13, wherein:
    the source region is projected with a mesa structure on the silicon substrate,
    the channel region is formed at a lower sidewall of the mesa structure on the silicon substrate,
    the drain region is formed on the channel region, and
    the gate electrode is formed over an upper sidewall of the mesa structure being separated by the gate dielectric layer on the source region and the channel region.

15. The compound tunneling field effect transistor of claim 13, wherein:
    a buffer layer is further formed of silicon germanium (SiGe) between the silicon substrate and the source region,
    the first semiconductor material is germanium (Ge), and
    the second and third semiconductor materials are gallium arsenide (GaAs).

16. The compound tunneling field effect transistor of claim 15, wherein the channel region is formed of aluminum gallium arsenide ($Al_xGa_{1-x}As$) adding aluminum to the second semiconductor material.

17. The compound tunneling field effect transistor of claim 16, wherein the content (x) of aluminum is $0<x\leq0.45$.

18. The compound tunneling field effect transistor of claim 14, wherein:
    a buffer layer is further formed of silicon germanium (SiGe) between the silicon substrate and the source region,
    the first semiconductor material is germanium (Ge), and
    the second and third semiconductor materials are gallium arsenide (GaAs).

19. The compound tunneling field effect transistor of claim 18, wherein the channel region is formed of aluminum gallium arsenide ($Al_xGa_{1-x}As$) adding aluminum to the second semiconductor material.

20. The compound tunneling field effect transistor of claim 19, wherein the content (x) of aluminum is $0<x\leq0.45$.

21. A compound tunneling field effect transistor comprising:
    a common source region formed in a stair shape having at least vertical and horizontal planes one side thereof and formed of a first semiconductor material having a first conductive type on a predetermined substrate;
    a common channel region formed in an 'L' shape on the vertical and horizontal planes of the common source region and formed of a second semiconductor material having a lattice constant difference with the first semiconductor material 2% or less, a bandgap wider than that of the first semiconductor material and electron mobility at least 5 times higher than that of silicon;
    a common drain region formed with a specific interval from the vertical and horizontal planes of the common source region, respectively, and formed of a third semiconductor material having a lattice constant difference with the second semiconductor material 1% or less, a bandgap wider than or equal to that of the second semiconductor material and a second conductive type opposite to the first conductive type on the common channel region;
    a first gate electrode formed on a first gate dielectric layer interlaid on an upper part of the vertical plane of the common source region and on the common channel region; and
    a second gate electrode formed on a second gate dielectric layer interlaid on the sidewalls of the common drain and channel regions and on one side of the horizontal plane of the common source region, wherein horizontal and vertical channels are formed.

22. The compound tunneling field effect transistor of claim 21 wherein:
the substrate is a silicon substrate,
a buffer layer is further formed of silicon germanium (SiGe) between the substrate and the common source region,
the first semiconductor material is germanium (Ge), and
the second and third semiconductor materials are gallium arsenide (GaAs).

23. The compound tunneling field effect transistor of claim 22, wherein the channel region is formed of aluminum gallium arsenide ($Al_xGa_{1-x}As$) adding aluminum to the second semiconductor material.

24. The compound tunneling field effect transistor of claim 23, wherein the content (x) of aluminum is $0<x\le0.45$.

25. A method for fabricating a compound tunneling field effect transistor, comprising:
a first step of epitaxially growing a first semiconductor layer having a bandgap at least 0.4 electron volts (eV) narrower than that of a silicon substrate with in situ doping of a dopant having a first conductive type on the silicon substrate;
a second step of epitaxially growing a second semiconductor layer having a bandgap wider than that of the first semiconductor layer and electron mobility at least 5 times higher than that of the silicon substrate on the first semiconductor layer;
a third step of epitaxially growing a third semiconductor layer having a bandgap wider than or equal to that of the second semiconductor layer with in situ doping of a dopant having a second conductive type opposite to the first conductive type on the second semiconductor layer;
a fourth step of forming drain, channel and source regions by etching the third, second and first semiconductor layers, respectively;
a fifth step of forming a gate dielectric layer on the drain, channel and source regions; and
a sixth step of forming a gate electrode by depositing and etching a gate material on the gate dielectric layer.

26. The method of claim 25, wherein:
the etching of the third, second and first semiconductor layers in the fourth step is carried out until a part of the first semiconductor layer is etched and a pillar shape is projected to form drain, channel and source regions from an upper part thereof, and
the etching of the gate material in the sixth step is to form the gate electrode wrapped one sidewall, both sidewalls or all sidewalls of the pillar shape interlaid with the gate dielectric layer.

27. The method of claim 25, wherein:
the etching of the third, second and first semiconductor layers in the fourth step is carried out until a part of the first semiconductor layer is etched and a mesa structure having a sidewall on one side thereof is projected to form drain, channel and source regions from an upper part thereof, and
the etching of the gate material in the sixth step is to form the gate electrode over the sidewall of the mesa structure interlaid with the gate dielectric layer.

28. The method of claim 25, further comprising epitaxially growing a buffer layer of silicon germanium (SiGe) on the silicon substrate before the first step, wherein:
the first semiconductor layer is epitaxially grown with germanium (Ge), and
the second and third semiconductor layers are epitaxially grown with gallium arsenide (GaAs).

29. The method of claim 28, wherein when the second semiconductor layer is epitaxially grown with gallium arsenide (GaAs), aluminum is added to form aluminum gallium arsenide ($Al_xGa_{1-x}As$).

30. The method of claim 29, wherein the content (x) of aluminum is $0<x\le0.45$.

31. The method of claim 26, further comprising epitaxially growing a buffer layer of silicon germanium (SiGe) on the silicon substrate before the first step, wherein:
the first semiconductor layer is epitaxially grown with germanium (Ge), and
the second and third semiconductor layers are epitaxially grown with gallium arsenide (GaAs).

32. The method of claim 31, wherein when the second semiconductor layer is epitaxially grown with gallium arsenide (GaAs), aluminum is added to form aluminum gallium arsenide ($Al_xGa_{1-x}As$).

33. The method of claim 32, wherein the content (x) of aluminum is $0<x\le0.45$.

34. The method of claim 27, further comprising epitaxially growing a buffer layer of silicon germanium (SiGe) on the silicon substrate before the first step, wherein:
the first semiconductor layer is epitaxially grown with germanium (Ge), and
the second and third semiconductor layers are epitaxially grown with gallium arsenide (GaAs).

35. The method of claim 34, wherein when the second semiconductor layer is epitaxially grown with gallium arsenide (GaAs), aluminum is added to form aluminum gallium arsenide ($Al_xGa_{1-x}As$).

36. The method of claim 35, wherein the content (x) of aluminum is $0<x\le0.45$.

37. A method for fabricating a compound tunneling field effect transistor, comprising:
a first step of forming a channel region by epitaxially growing a second semiconductor layer having electron mobility at least 5 times higher than that of a silicon substrate on the silicon substrate;
a second step of forming a source region by forming a first mask on the second semiconductor layer, etching one side of the second semiconductor layer using the first mask, and epitaxially growing a first semiconductor layer having a bandgap at least 0.4 electron volts (eV) narrower than that of the silicon substrate with in situ doping of a dopant having a first conductive type;
a third step of forming a drain region by forming a second mask on the first and second semiconductor layers, etching the other side of the second semiconductor layer using the second mask, and epitaxially growing a third semiconductor layer having a bandgap wider than or equal to that of the second semiconductor layer with in situ doping of a dopant having a second conductive type opposite to the first conductive type;
a fourth step of forming a gate dielectric layer on the source, channel and drain regions; and
a fifth step of forming a gate electrode by depositing and etching a gate material on the gate dielectric layer.

38. The method of claim 37, further comprising epitaxially growing a buffer layer of silicon germanium (SiGe) on the silicon substrate before the first step, wherein:
the first semiconductor layer is epitaxially grown with germanium (Ge), and
the second and third semiconductor layers are epitaxially grown with gallium arsenide (GaAs).

39. The method of claim 38, wherein when the second semiconductor layer is epitaxially grown with gallium arsenide (GaAs), aluminum is added to form aluminum gallium arsenide ($Al_xGa_{1-x}As$).

40. The method of claim 39, wherein the content (x) of aluminum is $0<x\leq0.45$.

41. A method for fabricating a compound tunneling field effect transistor, comprising:
- a first step of forming a source region having an projected mesa structure by epitaxially growing and etching a first semiconductor layer having a bandgap at least 0.4 electron volts (eV) narrower than that of a silicon substrate with in situ doping of a dopant having a first conductive type on the silicon substrate;
- a second step of forming a drain region a channel region by epitaxially growing a second semiconductor layer having electron mobility at least 5 times higher than that of the silicon substrate on the projected source region, epitaxially growing a third semiconductor layer having a bandgap wider than or equal to that of the second semiconductor layer with in situ doping of a dopant having a second conductive type opposite to the first conductive type on the second semiconductor layer, and anisotropically etching the third and second semiconductor layers, respectively;
- a third step of forming a gate dielectric layer on the source, channel and drain regions; and
- a fourth step of forming a gate electrode by depositing and etching a gate material on the gate dielectric layer.

42. The method of claim 41, wherein:
the anisotropically etching of the third and second conductor layers in the second step is to form the channel region on a lower sidewall of the mesa structure and to form the drain region on the channel region, and
the etching of the gate material in the fourth step is to form, by an anisotropically etching, the gate electrode over an upper sidewall of the mesa structure being separated by the gate dielectric layer on the source and channel regions.

43. The method of claim 41, wherein:
the etching of the first semiconductor layer in the first step is to form the source region in a stair shape having at least vertical and horizontal planes on one side thereof,
the anisotropically etching of the third and second conductor layers in the second step is to form the channel region in an 'L' shape on the vertical and horizontal planes of the source region and to form the drain region having an interval for separating from the vertical and horizontal planes of the source region, respectively, and
the etching of the gate material in the fourth step is to form, by an anisotropically etching, a first gate electrode over an upper part of the vertical plane of the source region and over the channel region interlaid with the gate dielectric layer, respectively, and to form a second gate electrode over sidewalls of the drain and channel regions and over one side of the horizontal plane of the source region interlaid with the gate dielectric layer, respectively.

44. The method of claim 41, further comprising epitaxially growing a buffer layer of silicon germanium (SiGe) on the silicon substrate before the first step, wherein:
the first semiconductor layer is epitaxially grown with germanium (Ge), and
the second and third semiconductor layers are epitaxially grown with gallium arsenide (GaAs).

45. The method of claim 44, wherein when the second semiconductor layer is epitaxially grown with gallium arsenide (GaAs), aluminum is added to form aluminum gallium arsenide ($Al_xGa_{1-x}As$).

46. The method of claim 45, wherein the content (x) of aluminum is $0<x\leq0.45$.

47. The method of claim 42, further comprising epitaxially growing a buffer layer of silicon germanium (SiGe) on the silicon substrate before the first step, wherein:
the first semiconductor layer is epitaxially grown with germanium (Ge), and
the second and third semiconductor layers are epitaxially grown with gallium arsenide (GaAs).

48. The method of claim 47, wherein when the second semiconductor layer is epitaxially grown with gallium arsenide (GaAs), aluminum is added to form aluminum gallium arsenide ($Al_xGa_{1-x}As$).

49. The method of claim 48, wherein the content (x) of aluminum is $0<x\leq0.45$.

50. The method of claim 43, further comprising epitaxially growing a buffer layer of silicon germanium (SiGe) on the silicon substrate before the first step, wherein:
the first semiconductor layer is epitaxially grown with germanium (Ge), and
the second and third semiconductor layers are epitaxially grown with gallium arsenide (GaAs).

51. The method of claim 50, wherein when the second semiconductor layer is epitaxially grown with gallium arsenide (GaAs), aluminum is added to form aluminum gallium arsenide ($Al_xGa_{1-x}As$).

52. The method of claim 51, wherein the content (x) of aluminum is $0<x\leq0.45$.

* * * * *